US012796440B2

(12) United States Patent
Yoo

(10) Patent No.: US 12,796,440 B2
(45) Date of Patent: Nov. 10, 2026

(54) SEMICONDUCTOR DEVICE INCLUDING BACK-SIDE CONTACT AND METHOD OF FABRICATING THE SAME

(71) Applicant: Samsung Electronics Co., Ltd., Suwon-si (KR)

(72) Inventor: Jongryeol Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 481 days.

(21) Appl. No.: 18/464,539

(22) Filed: Sep. 11, 2023

(65) Prior Publication Data

US 2024/0282708 A1 Aug. 22, 2024

(30) Foreign Application Priority Data

Feb. 22, 2023 (KR) ........................ 10-2023-0023677

(51) Int. Cl.

| | |
|---|---|
| ***H10D 84/00*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |

(Continued)

(52) U.S. Cl.

CPC ........ *H10W 20/427* (2026.01); *H10D 30/014* (2025.01); *H10D 30/43* (2025.01); *H10D 30/6729* (2025.01); *H10D 30/6735* (2025.01); *H10D 62/121* (2025.01); *H10D 62/151* (2025.01); *H10D 64/0112* (2026.01); *H10D 64/017* (2025.01); *H10D 84/0167* (2025.01); *H10D 84/017* (2025.01); *H10D 84/0186* (2025.01); *H10D 84/038* (2025.01); *H10D 84/85* (2025.01)

(58) Field of Classification Search

CPC ............... H10D 84/841; H10D 84/832; H10D 84/0186; H10D 62/121; H10D 84/851; H10D 30/6735; H10D 30/501; H10D 30/503; H01L 23/5286; H01L 30/6735; H01L 30/501; H01L 30/503

See application file for complete search history.

(56) References Cited

U.S. PATENT DOCUMENTS

| | | | |
|---|---|---|---|
| 11,222,892 | B2 | 1/2022 | Su et al. |
| 11,289,606 | B2 | 3/2022 | Ju et al. |
| 11,355,601 | B2 | 6/2022 | Chiang et al. |

(Continued)

FOREIGN PATENT DOCUMENTS

KR 10-2021-0133850 A 11/2021

*Primary Examiner* — Reema Patel

(74) *Attorney, Agent, or Firm* — Harness, Dickey & Pierce, P.L.C.

(57) ABSTRACT

A semiconductor device may include a substrate, a lower power line buried in a lower portion of the substrate, a source/drain pattern on the substrate, an interlayer insulating layer on the source/drain pattern, and a back-side contact penetrating the substrate and electrically connecting the lower power line to the source/drain pattern. The back-side contact may penetrate the source/drain pattern and may include a first surface in contact with the interlayer insulating layer.

20 Claims, 37 Drawing Sheets

(51) Int. Cl.
*H10D 84/85* (2025.01)
*H10W 20/41* (2026.01)

(56) References Cited

U.S. PATENT DOCUMENTS

| | | | | |
|---|---|---|---|---|
| 11,398,553 | B2 | 7/2022 | Lin et al. | |
| 11,424,332 | B2 | 8/2022 | Yu et al. | |
| 11,450,665 | B2 | 9/2022 | Chiang et al. | |
| 11,482,594 | B2 | 10/2022 | Yu et al. | |
| 2021/0351303 | A1* | 11/2021 | Ju | H01L 21/76897 |
| 2021/0408274 | A1 | 12/2021 | Yu et al. | |
| 2023/0106015 | A1* | 4/2023 | Kim | H01L 21/743<br>257/288 |

* cited by examiner

SEMICONDUCTOR DEVICE INCLUDING BACK-SIDE CONTACT AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2023-0023677, filed on Feb. 22, 2023, in the Korean Intellectual Property Office, the entire contents of which are hereby incorporated by reference.

BACKGROUND

The present disclosure relates to semiconductor devices and/or methods of fabricating the same, and in particular, to semiconductor devices including a field effect transistor and/or methods of fabricating the same.

A semiconductor device includes an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize the semiconductor devices with high performance.

SUMMARY

Some example embodiments of the inventive concepts provide semiconductor devices with improved electrical and reliability characteristics.

Some example embodiments of the inventive concepts provide methods of fabricating a semiconductor device with improved electrical and reliability characteristics.

According to an example embodiment of the inventive concepts, a semiconductor device includes a substrate, a lower power line buried in a lower portion of the substrate, a source/drain pattern on the substrate, an interlayer insulating layer on the source/drain pattern, and a back-side contact penetrating the substrate and electrically connecting the lower power line to the source/drain pattern, wherein the back-side contact penetrates the source/drain pattern and includes a first surface in contact with the interlayer insulating layer.

According to an example embodiment of the inventive concepts, a semiconductor device includes a substrate, a lower power line buried in a lower portion of the substrate, a source/drain pattern on the substrate, a first source/drain pattern and a second source/drain pattern on the substrate, a channel pattern interposed between the first and second source/drain patterns, the channel pattern including a plurality of semiconductor patterns, the plurality of semiconductor patterns being vertically stacked to be spaced apart from each other, an interlayer insulating layer on the first and second source/drain patterns, an active contact penetrating the interlayer insulating layer and electrically connected to the first source/drain pattern, and a back-side contact penetrating the substrate and electrically connecting the lower power line to the second source/drain pattern, wherein a level of a bottommost surface of the active contact is lower than a level of a top surface of a lowermost one of the semiconductor patterns, and a level of a top surface of the back-side contact is higher than the level of the top surface of the lowermost one of the semiconductor patterns.

According to an example embodiment of the inventive concepts, a semiconductor device includes a substrate, a channel pattern on the substrate, the channel pattern including a plurality of semiconductor patterns stacked to be spaced apart from each other, a source/drain pattern connected to the channel pattern, a gate electrode on the channel pattern, a gate insulating layer interposed between the gate electrode and the channel pattern, a gate spacer on a side surface of the gate electrode, a gate capping pattern on a top surface of the gate electrode, an interlayer insulating layer covering the source/drain pattern and the gate capping pattern, a gate contact penetrating the interlayer insulating layer and the gate capping pattern and electrically connected to the gate electrode, a first metal layer on the interlayer insulating layer, the first metal layer including a first interconnection line electrically connected to the gate contact, a second metal layer on the first metal layer, the second metal layer including a second interconnection line electrically connected to the first metal layer, a lower power line in a lower portion of the substrate, a back-side contact penetrating the substrate and electrically connecting the lower power line to the source/drain pattern, and a silicide layer interposed between the back-side contact and the source/drain pattern, wherein the back-side contact has a first width at a low level thereof, a second width at a middle level thereof, and a third width at a high level thereof, the first width is larger than the second width, and the third width is larger than the second width.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about"

or "substantially," it will be understood that these values and shapes should be construed as including a manufacturing or operational tolerance (e.g., ±10%) around the stated numerical values or shapes.

Figure 1:
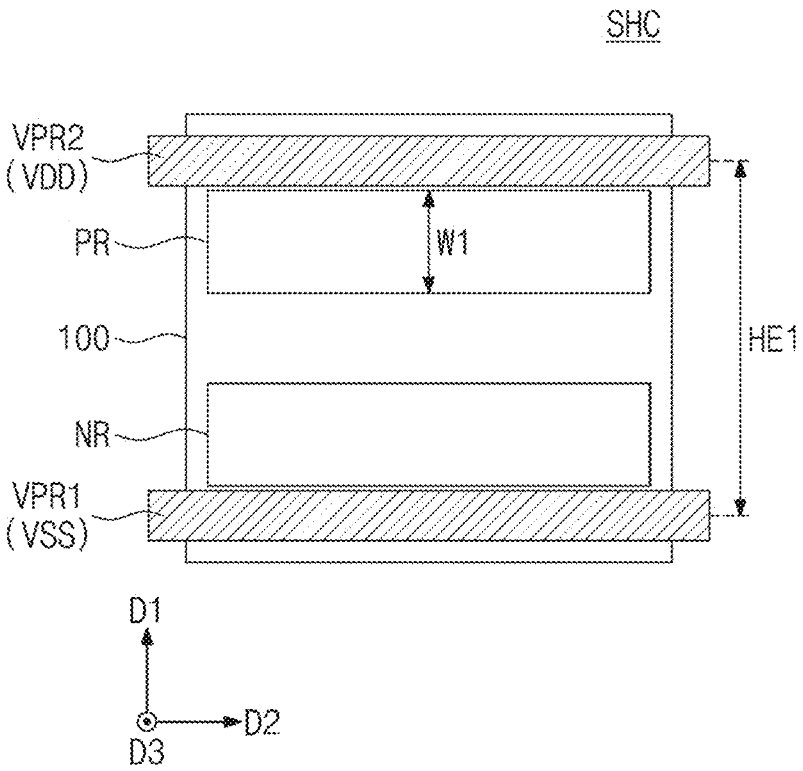
FIGS. 1 to 3 are conceptual diagrams illustrating logic cells in a semiconductor device according to some example embodiment of the inventive concepts.
Figure 2:
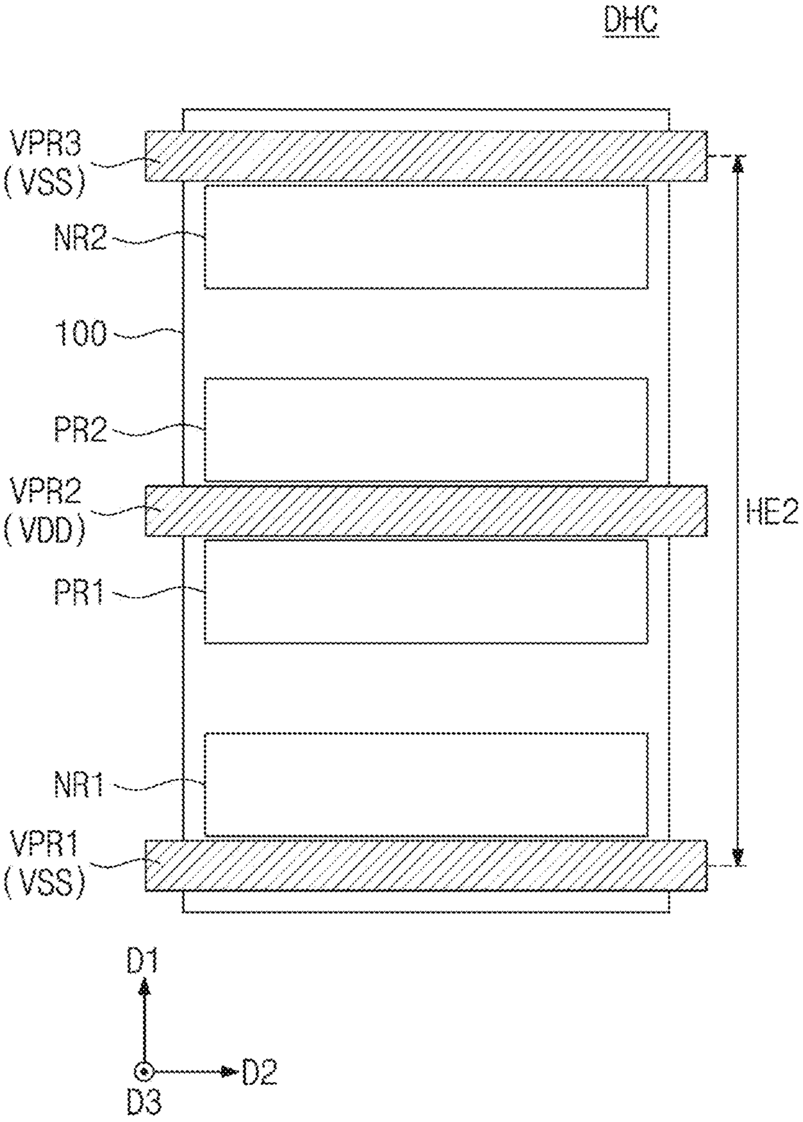
Figure 3:
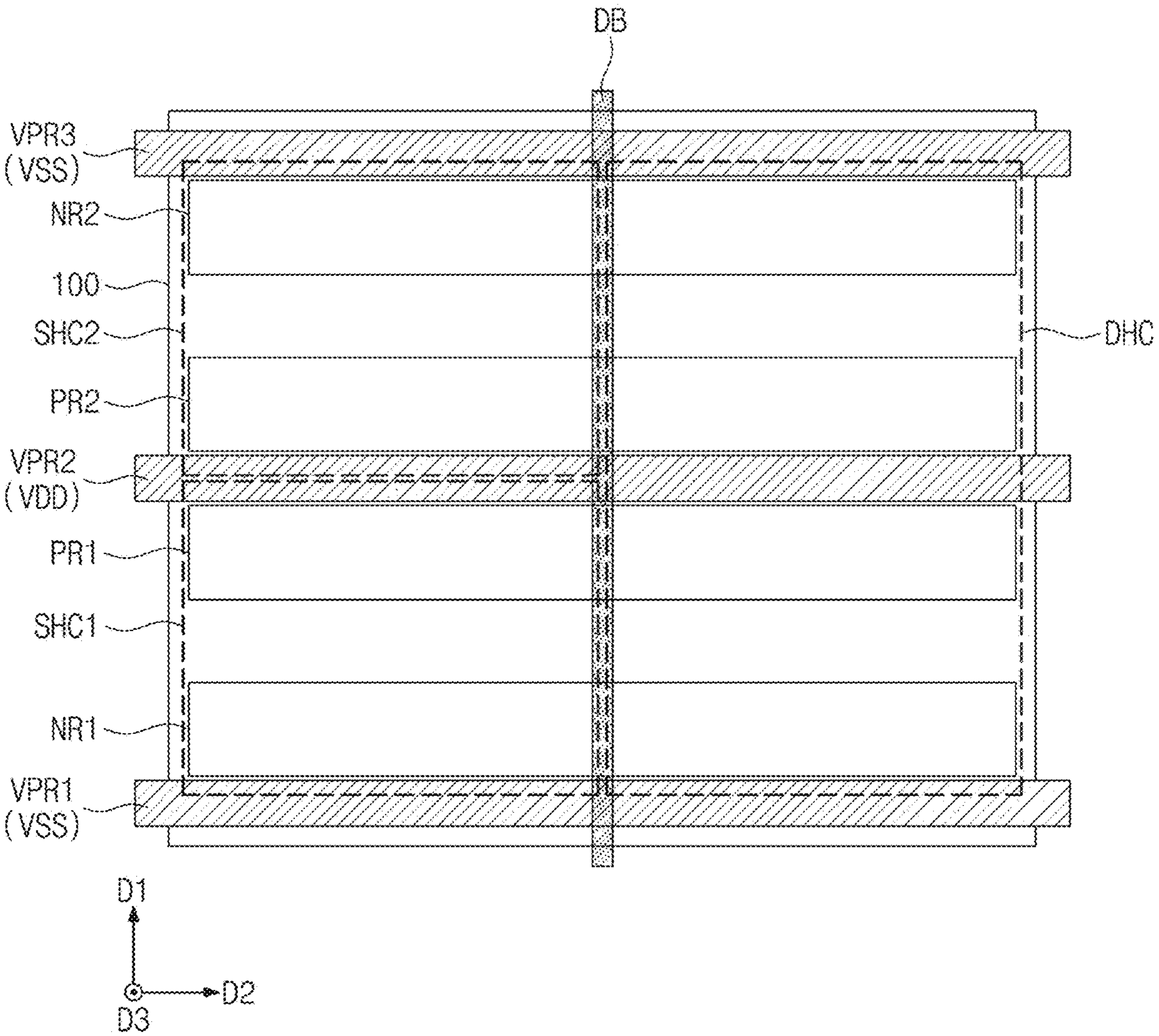

FIGS. 1 to 3 are conceptual diagrams illustrating logic cells in a semiconductor device according to some example embodiment of the inventive concepts.

Referring to FIG. 1, a single height cell SHC may be provided. For example, a first lower power line VPR1 and a second lower power line VPR2 may be provided in a lower portion of a substrate 100. The first lower power line VPR1 may be a conduction path, to which a source voltage VSS (e.g., a ground voltage) is provided. The second lower power line VPR2 may be a conduction path, to which a drain voltage VDD (e.g., a power voltage) is provided.

The single height cell SHC may be defined between the first lower power line VPR1 and the second lower power line VPR2. The single height cell SHC may include one PMOSFET region PR and one NMOSFET region NR. In other words, the single height cell SHC may have a CMOS structure provided between the first lower power line VPR1 and the second lower power line VPR2.

Each of the PMOSFET and NMOSFET regions PR and NR may have a first width in a first direction D1. A length of the single height cell SHC in the first direction D1 may be defined as a first height HE1. The first height HE1 may be substantially equal to a distance (e.g., pitch) between the first lower power line VPR1 and the second lower power line VPR2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. For example, the first lower power line VPR1, the second lower power line VPR2, and a third lower power line VPR3 may be provided on the substrate 100. The second lower power line VPR2 may be disposed between the first lower power line VPR1 and the third lower power line VPR3. The third lower power line VPR3 may be a conduction path, to which the source voltage VSS is provided.

The double height cell DHC may be defined between the first lower power line VPR1 and the third lower power line VPR3. The double height cell DHC may include a first PMOSFET region PR1, a second PMOSFET region PR2, a first NMOSFET region NR1, and a second NMOSFET region NR2.

The first NMOSFET region NR1 may be adjacent to the first lower power line VPR1. The second NMOSFET region NR2 may be adjacent to the third lower power line VPR3. The first and second PMOSFET regions PR1 and PR2 may be adjacent to the second lower power line VPR2. When viewed in a plan view, the second lower power line VPR2 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region. Thus, a channel size of the PMOS transistor of the double height cell DHC may be larger than a channel size of the PMOS transistor of the single height cell SHC of FIG. 1.

For example, the channel size of the PMOS transistor of the double height cell DHC may be about two times the channel size of the PMOS transistor of the single height cell SHC. In this case, the double height cell DHC may be operated at a higher speed than the single height cell SHC. In an example embodiment, the double height cell DHC shown in FIG. 2 may be referred to as a multi-height cell. Although not shown, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second lower power lines VPR1 and VPR2. The second single height cell SHC2 may be disposed between the second and third lower power lines VPR2 and VPR3. The second single height cell SHC2 may be adjacent to the first single height cell SHC1 in the first direction D1.

The double height cell DHC may be disposed between the first and third lower power lines VPR1 and VPR3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. An active region of the double height cell DHC may be electrically disconnected from an active region of each of the first and second single height cells SHC1 and SHC2 by the division structure DB.

Figure 4:
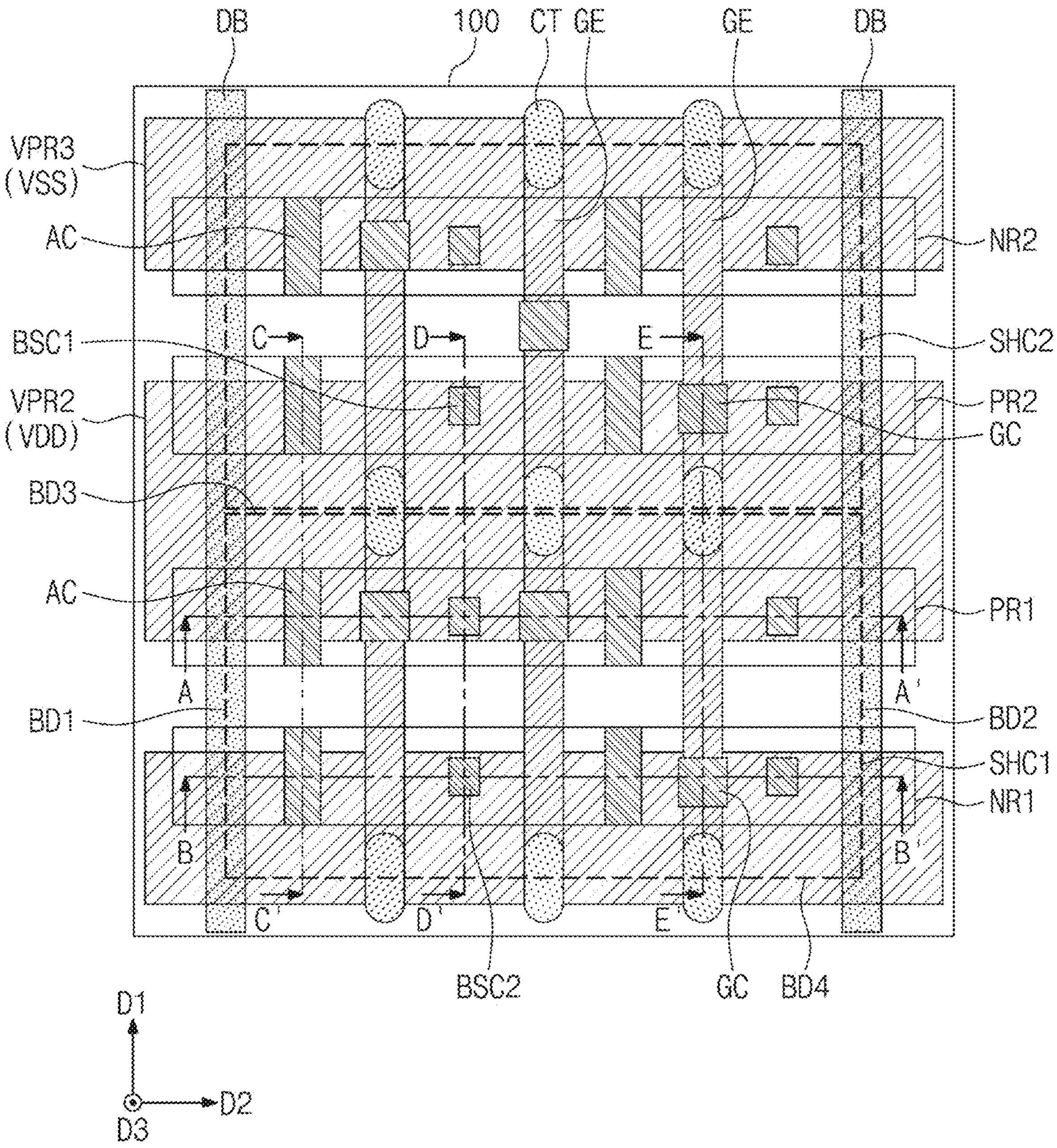
FIG. 4 is a plan view illustrating a semiconductor device according to an example embodiment of the inventive concepts.

FIG. 4 is a plan view illustrating a semiconductor device according to an example embodiment of the inventive concepts. FIGS. 5A to 5D are sectional views taken along lines A-A', B-B', C-C', and D-D' of FIG. 4, respectively. FIGS. 4 and 5A to 5D illustrate an example of a detailed structure of the first and second single height cells SHC1 and SHC2 of FIG. 3.

Referring to FIG. 4 and FIGS. 5A to 5D, two single single height cells SHC may be provided on the substrate 100. Logic transistors constituting a logic circuit may be disposed on the single height cell SHC. The substrate 100 may be a semiconductor substrate that is formed of or includes silicon, germanium, silicon germanium, a compound semiconductor material, or the like. In an embodiment, the substrate 100 may be a silicon wafer. Lower power lines VPR1 to VPR3, which will be described below, may be disposed in an insulating layer of the substrate 100.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may be extended in the second direction D2. Each of the first and second active patterns AP1 and AP2 may be a vertically-protruding portion of the substrate 100.

A device isolation layer ST may fill the trench TR. The device isolation layer ST may cover a side surface of each of the first and second active patterns AP1 and AP2. The device isolation layer ST may be formed of or include silicon oxide. The device isolation layer ST may not cover first and second channel patterns CH1 and CH2 to be described below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3). The first semiconductor pattern SP1 may be the lowermost one of the semiconductor patterns, and the third semiconductor pattern SP3 may be the uppermost one of the semiconductor patterns.

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon (e.g., single-crystalline silicon). In an example embodiment, the first to third semiconductor patterns SP1, SP2, and SP3 may be stacked nanosheets.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked the first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between a pair of the second source/drain patterns SD2. In other words, each pair of the second source/drain patterns SD2 may be connected to each other by the stacked the first to third semiconductor patterns SP1, SP2, and SP3.

The first and second source/drain patterns SD1 and SD2 may be epitaxial patterns, which are formed by a selective epitaxial growth (SEG) process. As an example, a top surface of each of the first and second source/drain patterns SD1 and SD2 may be positioned at substantially the same level as a top surface of the third semiconductor pattern SP3. However, in an example embodiment, the top surface of each of the first and second source/drain patterns SD1 and SD2 may be higher than the top surface of the third semiconductor pattern SP3.

In an example embodiment, the first source/drain patterns SD1 may be formed of or include a semiconductor material whose lattice constant is greater than that of the substrate 100. For example, the first source/drain patterns SD1 may be formed of or include at least one of silicon (Si) or silicon-germanium (SiGe). Accordingly, each pair of the first source/drain patterns SD1 may exert a compressive stress on the first channel pattern CH1 therebetween. The second source/drain patterns SD2 may be formed of or include the same semiconductor material as the substrate 100. For example, the second source/drain patterns SD2 may be formed of or include at least one of silicon-arsenic (SiAs) or silicon-phosphorus (SiP).

The first source/drain patterns SD1 may include first active source/drain patterns SD1*a* and first back-side source/drain patterns SD1*b*. That is, each pair of the first source/drain patterns SD1 may be composed of one first active source/drain pattern SD1*a* and one first back-side source/drain pattern SD1*b*. The second source/drain patterns SD2 may include second active source/drain patterns SD2*a* and second back-side source/drain patterns SD2*b*.

The first and second active source/drain patterns SD1*a* and SD2*a* may be in contact with active contacts AC, which will be described below. The first and second back-side source/drain patterns SD1*b* and SD2*b* may be in contact with back-side contacts BSC, which will be described below.

The first and second source/drain patterns SD1 and SD2 may contain impurities. Impurity concentrations of the first and second source/drain patterns SD1 and SD2 may increase as a distance to the active contact AC decreases. For example, the first and second source/drain patterns SD1 and SD2 may have the highest impurity concentration at a contact surface between a silicide layer SC and the first and second source/drain patterns SD1 and SD2. As a distance from the contact surface increases, the impurity concentration may decrease. The impurities in the first source/drain pattern SD1 may include at least one of boron (B), gallium (Ga), or indium (In). The impurities in the second source/drain pattern SD2 may include at least one of arsenic (As), phosphorus (P), or antimony (Sb). In an example embodiment, the impurities in the source/drain patterns SD1 and SD2 may include argon (Ar) or germanium (Ge).

Gate electrodes GE may be provided on the first and second channel patterns CH1 and CH2. Each of the gate electrodes GE may be extended in the first direction D1 to cross the first and second channel patterns CH1 and CH2. Each of the gate electrodes GE may vertically overlap the first and second channel patterns CH1 and CH2. The gate electrodes GE may be arranged at a first pitch in the second direction D2.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

The gate electrode GE may be provided on a top surface TS, a bottom surface BT, and opposite side surfaces SW of each of the first to third semiconductor patterns SP1, SP2, and SP3. That is, the transistor according to the present example embodiment may be a three-dimensional field effect transistor (e.g., Multi-Bridge-Channel FET (MBCFET) or Gate-All-Around FET (GAAFET)) in which the gate electrode GE is provided to three-dimensionally surround the channel pattern.

As an example, the first single height cell SHC1 may have a first border BD1 and a second border BD2, which are opposite to each other in the second direction D2. The first and second borders BD1 and BD2 may extend in the first direction D1. The first single height cell SHC1 may have a third border BD3 and a fourth border BD4, which are opposite to each other in the first direction D1. The third and fourth borders BD3 and BD4 may extend in the second direction D2.

Gate cutting patterns CT may be disposed on borders, which are parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may overlap the gate electrodes GE, respectively. The gate cutting patterns CT may be formed of or include at least one of insulating materials (e.g., silicon oxide, silicon nitride, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE, which are placed on the first and second single height cells SHC1 and SHC2 and aligned to each other in the first direction D1. That is, the gate electrode GE extending in the first direction D1 may be divided into a plurality of the gate electrodes GE by the gate cutting patterns CT.

Referring back to FIG. 4 and FIGS. 5A to 5D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an example embodiment, the gate spacers GS may be a multi-layered structure, which includes at least two different materials selected from SiCN, SiCON, and SiN.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. For example, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BT, and opposite side surfaces SW of each of the first to third semiconductor patterns SP1, SP2, and SP3. The gate insulating layer GI may cover the top surface of the device isolation layer ST below the gate electrode GE.

In an example embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern including the work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In an example embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may include at least one metallic material, which is selected from the group consisting of tungsten (W), aluminum (Al), titanium (Ti), and tantalum (Ta). In an example embodiment, the fourth portion PO4 of the gate electrode GE may include the first metal pattern and the second metal pattern on the first metal pattern.

Referring back to FIG. 5B, inner spacers IP may be provided on the first and second NMOSFET regions NR1 and NR2. That is, the inner spacers IP may be provided on the second active pattern AP2. The inner spacers IP may be respectively interposed between the second source/drain pattern SD2 and the first to third portions PO1, PO2, and PO3 of the gate electrode GE. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an example embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, a pair of the division structures DB may be respectively provided on the first and second borders BD1 and BD2 of the first single height cell SHC1. The division structure DB may be extended in the first direction D1 to be parallel to the gate electrodes GE. A pitch between the division structure DB and the gate electrode GE adjacent thereto may be equal to the first pitch.

The division structure DB may penetrate the gate capping pattern GP and the gate electrode GE and may be extended into the first and second active patterns AP1 and AP2. The division structure DB may penetrate an upper portion of each of the first and second active patterns AP1 and AP2. The division structure DB may electrically separate an active region of each of the first and second single height cells SHC1 and SHC2 from an active region of a neighboring cell.

Active contacts AC may penetrate the first and second interlayer insulating layers 110 and 120 and to be electrically connected to the first and second source/drain patterns SD1 and SD2, respectively. Each of the active contacts AC may be provided adjacent to a side of the gate electrode GE. When viewed in a plan view, the active contact AC may be a bar-shaped pattern that extends in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

The active contact AC and the first and second source/drain patterns SD1 and SD2 will be described in more detail with reference to FIGS. 5A to 5D. The active contact AC may penetrate the first interlayer insulating layer 110 and may be formed in the first and second active source/drain patterns SD1*a* and SD2*a*.

As a vertical level is lowered, a width of the active contact AC in the second direction D2 may decrease. The active contact AC may have a bottommost surface BW. The bottommost surface BW may be located below a top surface TW of the first semiconductor pattern SP1. The bottommost surface BW may be located below a top surface of the first portion PO1 of the gate electrode GE (e.g., see FIG. 5A).

The active contact AC, which is formed in the first and second active source/drain patterns SD1*a* and SD2*a*, may have a vertical length LG1. The vertical length LG1 may be a vertical distance between the bottommost and topmost surfaces of the active contact AC. The vertical length LG1 may be smaller than a vertical distance between the bottommost and topmost surfaces of the first and second active source/drain patterns SD1*a* and SD2*a*. The active contact AC may be deeply formed toward bottom surfaces of the first and second active source/drain patterns SD1*a* and SD2*a*. Accordingly, a contact area between the active contact AC and the first and second active source/drain patterns SD1*a* and SD2*a* may be increased. Thus, a contact resistance therebetween may be lowered. The vertical length LG1 of the active contact AC may be adjustable, and this will be discussed in greater detail in reference to the fabrication method provided below.

A silicide layer SC may be interposed between the active contact AC and each of the first and second active source/drain patterns SD1*a* and SD2*a*. The silicide layer SC may enclose an outer surface of the active contact AC. The silicide layer SC may cover side and bottom surfaces of the active contact AC. The bottommost surface of the silicide layer SC may be lower than the bottommost surface BW of the active contact AC. A top surface of the silicide layer SC may be located at a level that is equal to or higher than the top surfaces of the first and second active source/drain patterns SD1*a* and SD2*a*.

A mean thickness of the silicide layer SC may be smaller than a mean thickness of the first and second active source/drain patterns SD1*a* and SD2*a*. In an example embodiment, a contact surface between the silicide layer SC and the active contact AC and a contact surface between the silicide layer SC and the first and second active source/drain patterns SD1*a* and SD2*a* may have a wave-shaped profile.

The silicide layer SC may be a metal-semiconductor compound layer. The active contact AC may be electrically connected to the source/drain pattern SD1 or SD2 through the silicide layer SC. In an example embodiment, the silicide layer SC may be formed of or include at least one of titanium silicide, tantalum silicide, tungsten silicide, nickel silicide, or cobalt silicide.

The active contact AC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. At least a portion of the barrier pattern BM may be interposed between the silicide layer SC and the conductive pattern FM. In an example embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CON), or platinum nitride (PtN).

Gate contacts GC may penetrate the second interlayer insulating layer 120 and the gate capping pattern GP and may be electrically connected to the gate electrodes GE, respectively. When viewed in a plan view, two gate contacts GC on the first single height cell SHC1 may be disposed to overlap the first PMOSFET region PR1. In other words, the two gate contacts GC on the first single height cell SHC1 may be provided on the first active pattern AP1 (e.g., see FIG. 5A). When viewed in a plan view, one gate contact GC on the first single height cell SHC1 may be disposed to overlap the first NMOSFET region NR1. In other words, the gate contact GC on the first single height cell SHC1 may be provided on the second active pattern AP2 (e.g., see FIG. 5B).

The gate contact GC may be freely disposed on the gate electrode GE, without any restrictions on its position. For example, the gate contacts GC on the second single height cell SHC2 may be respectively disposed on the second PMOSFET region PR2, the second NMOSFET region NR2, and the device isolation layer ST filling the trench TR (e.g., see FIG. 4).

Figure 5A:
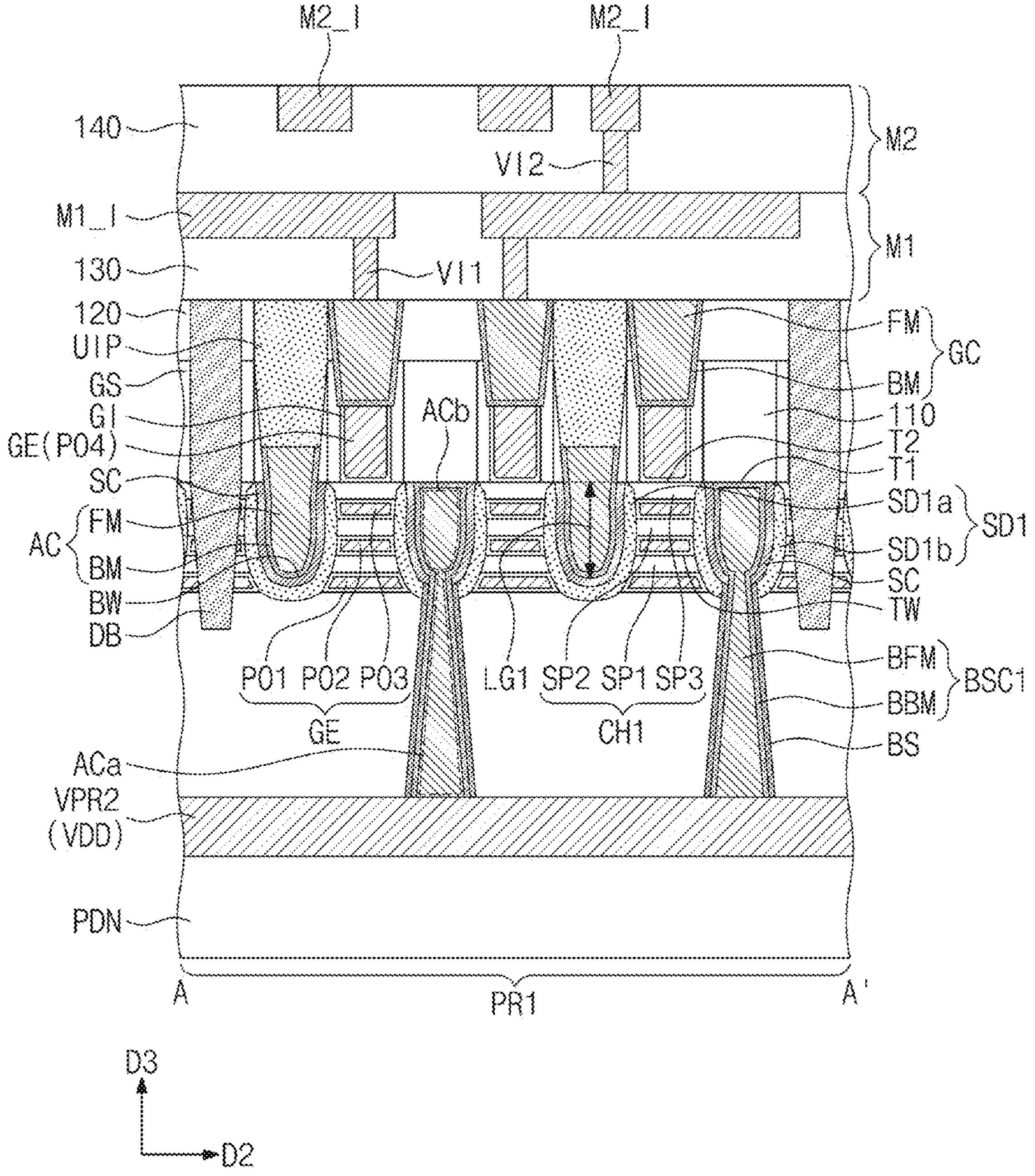
FIGS. 5A to 5D are sectional views taken along lines A-A', B-B', C-C', and D-D' of FIG. 4, respectively.
Figure 5B:
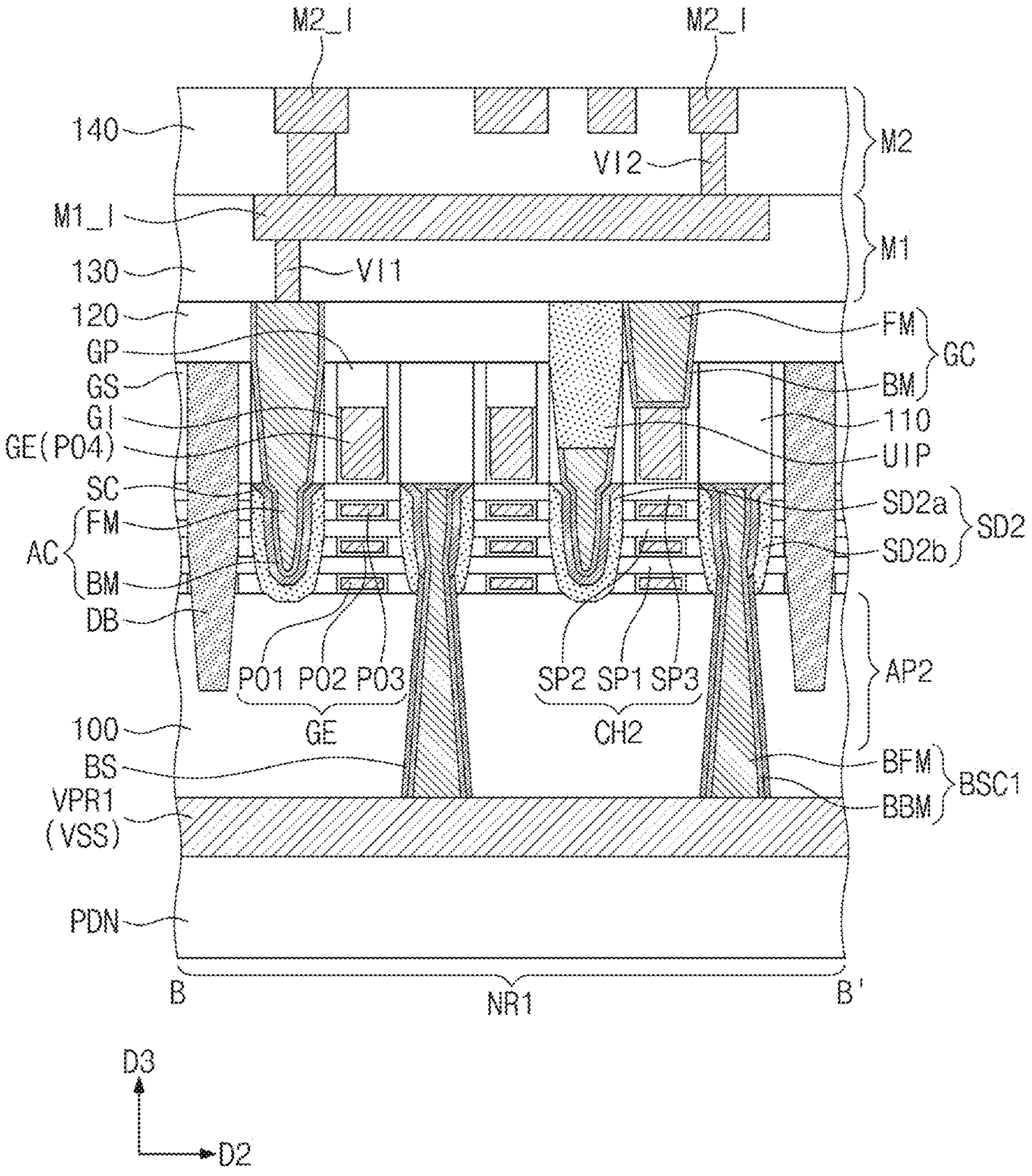
Figure 5C:
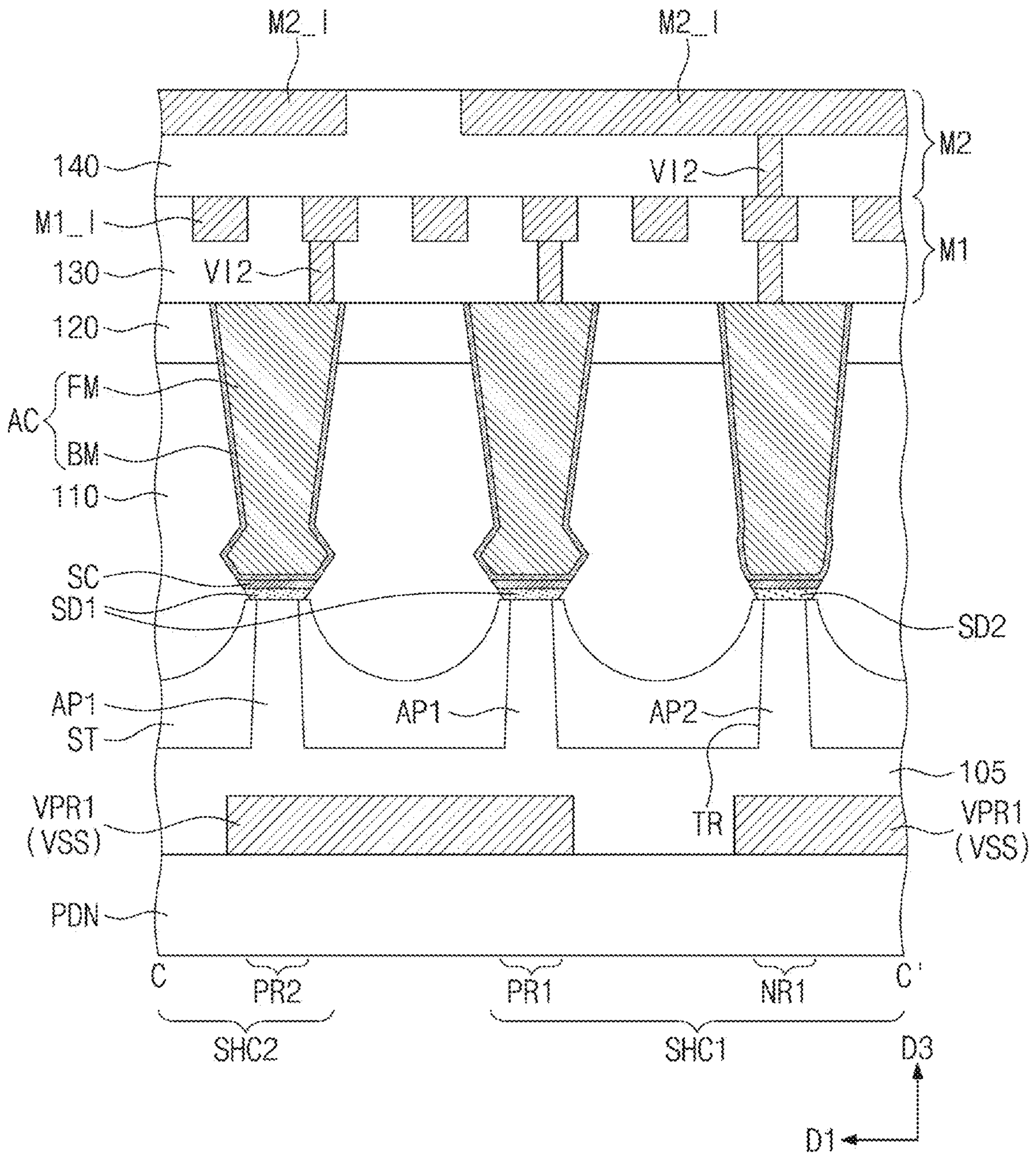
Figure 5D:
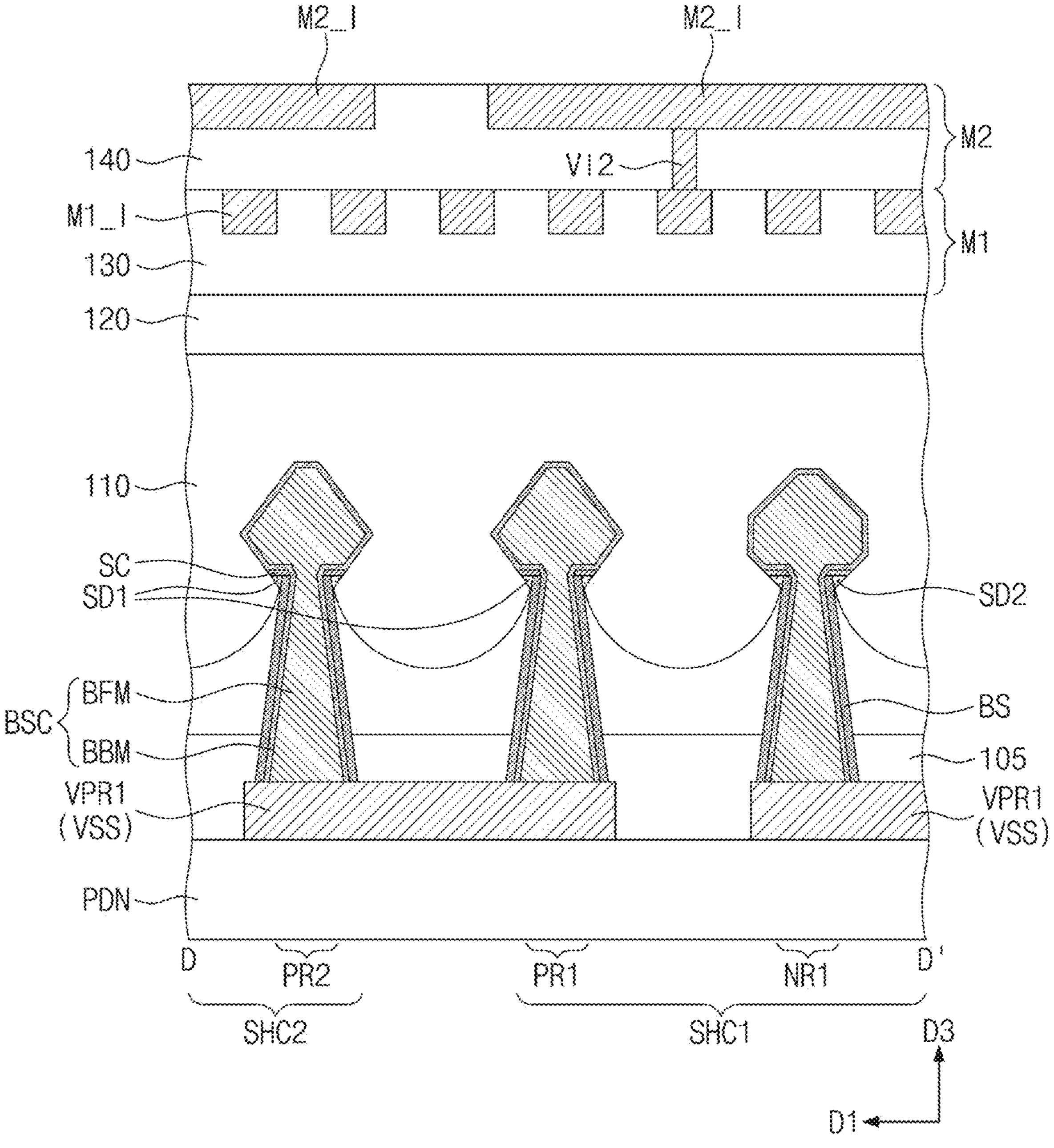

In an example embodiment, referring to FIGS. 5A and 5B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a lower level than the bottom surface of the gate contact GC by the upper insulating pattern UIP. Accordingly, it may be possible to mitigate or prevent the gate contact GC and the active contact AC, which are adjacent to each other, from being in contact with each other and thereby to mitigate or prevent a short circuit issue from occurring therebetween. The upper insulating pattern UIP may be formed of or include at least one of silicon-based insulating materials (e.g., silicon oxide, silicon nitride, and silicon oxynitride).

The gate contact GC may include the conductive pattern FM and the barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. In an example embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CON), or platinum nitride (PtN).

Referring back to FIGS. 4 and 5A to 5D, the first to third lower power lines VPR1, VPR2, and VPR3 may be provided in a lower portion of the substrate 100. The first to third lower power lines VPR1, VPR2, and VPR3 may extend in the second direction D2 to be parallel to each other. The first lower power line VPR1 may be disposed on the fourth border BD4 of the first single height cell SHC1. The second lower power line VPR2 may be disposed on the third border BD3 of the first single height cell SHC1. In other words, the first single height cell SHC1 may be defined between the first lower power line VPR1 and the second lower power line VPR2. The second single height cell SHC2 may be defined between the second lower power line VPR2 and the third lower power line VPR3.

In an example embodiment, the first lower power line VPR1 may vertically overlap the first NMOSFET region NR1. The second lower power line VPR2 may vertically overlap the first PMOSFET region PR1 and the second PMOSFET region PR2. The third lower power line VPR3 may vertically overlap the second NMOSFET region NR2.

The first to third lower power lines VPR1 to VPR3 may be formed of or include at least one selected from the group consisting of copper, molybdenum, tungsten, and ruthenium. A bottom surface of each of the first to third lower power lines VPR1 to VPR3 may be coplanar with a bottom surface of the substrate 100.

A power delivery network layer PDN may be provided on the bottom surface of the substrate 100. The power delivery network layer PDN may include a plurality of lower interconnection lines, which are electrically connected to the first to third lower power lines VPR1 to VPR3. As an example, the power delivery network layer PDN may include a wiring network, which is used to apply the source voltage VSS to the first and third lower power lines VPR1 and VPR3. The power delivery network layer PDN may include a wiring network, which is used to apply the drain voltage VDD to the second lower power line VPR2.

Referring back to FIGS. 5A, 5B, and 5D, a first back-side contact BSC1 may vertically extend from the second lower power line VPR2 to the first source/drain pattern SD1 through the substrate 100. A second back-side contact BSC2 may vertically extend from the first lower power line VPR1 to the second source/drain pattern SD2 through the substrate 100.

The first back-side contact BSC1 may be a pillar-shaped pattern vertical and electrically connecting the second lower power line VPR2 to the first source/drain pattern SD1. The drain voltage VDD may be applied to the first source/drain pattern SD1 through the first back-side contact BSC1. The second back-side contact BSC2 may be a pillar-shaped pattern vertical and electrically connecting the first lower power line VPR1 to the second source/drain pattern SD2. The source voltage VSS may be applied to the second source/drain pattern SD2 through the second back-side contact BSC2.

The first or second back-side contact BSC1 or BSC2 may penetrate the first or second back-side source/drain patterns SD1*b* or SD2*b* and to be in contact with the first interlayer insulating layer 110. That is, each of the first and second back-side contacts BSC1 and BSC2 may include a first surface T1 in contact with the first interlayer insulating layer 110. The first surface T1 may be a top surface of each of the first and second back-side contacts BSC1 and BSC2. A level of the first surface T1 may be equal to a level of a top surface T2 of the uppermost semiconductor pattern SP3. In an example embodiment, the level of the first surface T1 may be higher than the level of the top surface T2 of the uppermost semiconductor pattern SP3. The level of the first surface T1 may be higher than the level of the top surface TW of the first semiconductor pattern SP1.

Referring to FIGS. 5A and 5B, each of the first and second back-side contacts BSC1 and BSC2 may have a width in the second direction D2. The widths of the first and second back-side contacts BSC1 and BSC2 may decrease initially and then increase in the third direction D3 from bottom surfaces of the first and second back-side contacts BSC1 and BSC2. That is, the back-side contact may have a first width at a low level thereof, a second width at a middle level thereof, and a third width at a high level thereof. The first width may be larger than the second width, and the third width may be larger than the second width.

For example, the first back-side contact BSC1 may include a first portion ACa, which is placed in a back-side spacer BS, and a second portion ACb, which is placed in the silicide layer SC. A width of the first portion ACa of the back-side contact BSC may decrease as a distance in the third direction D3 increases. By contrast, a width of the second portion ACb of the back-side contact BSC may increase as a distance in the third direction D3 increases.

The back-side spacer BS may be interposed between the first and second back-side contacts BSC1 and BSC2 and the substrate 100. The back-side spacer BS may have a shape of a spacer. The back-side spacer BS may cover a portion of a side surface of each of the first and second back-side contacts BSC1 and BSC2. At least a portion of the back-side spacer BS may also be interposed between the first and second back-side contacts BSC1 and BSC2 and the first and second back-side source/drain patterns SD1*b* and SD2*b*. This is because, in a fabrication process to be described below, lower portions of the first and second back-side source/drain patterns SD1*b* and SD2*b* are etched and then the back-side spacer BS is formed on the etched lower portions of the first and second back-side source/drain patterns SD1*b* and SD2*b*.

The first and second back-side contacts BSC1 and BSC2 may include a back conductive pattern BFM and a back barrier pattern BBM enclosing the back conductive pattern BFM. The back conductive and back barrier patterns BFM and BBM of the first back-side contact BSC1 may be substantially the same as the back conductive and back barrier patterns BFM and BBM of the active contact AC. For example, the back conductive pattern BFM may be formed of or include at least one metal of aluminum, copper, tungsten, molybdenum, or cobalt. The back barrier pattern BBM may cover top and side surfaces of the back conductive pattern BFM. A portion of the back barrier pattern BBM may be interposed between the silicide layer SC and the back conductive pattern BFM, and another portion of the back barrier pattern BBM may be interposed between the back-side spacer BS and the back conductive pattern BFM.

In an example embodiment, the back barrier pattern BBM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CON), or platinum nitride (PtN).

Referring to FIGS. 5A to 5D, in one pair of the first and second source/drain patterns SD1 and SD2, one pattern may be connected to the active contact AC, and the other pattern may be connected to the back-side contact BSC. Here, the active contact AC may be deeply formed to reduce a contact resistance thereof. Furthermore, because the back-side contact BSC penetrates the first or second source/drain pattern SD1 or SD2, a contact area between the back-side contact BSC and the first or second source/drain pattern SD1 or SD2 may be increased, and in this case, a contact resistance therebetween may be reduced. In addition, an impurity-doped region may be formed between the first and second source/drain patterns SD1 and SD2 and the back-side contact BSC and between the first and second source/drain patterns SD1 and SD2 and the active contact AC, and this may lead to a reduction in contact resistances between them. Thus, it may be possible to improve electrical and reliability characteristics of a semiconductor device.

Referring back to FIGS. 4 and 5A to 5E, a first metal layer M1 may be provided in the third interlayer insulating layer 130. The first metal layer M1 may include first interconnection lines M1_I. The first interconnection lines M1_I of the first metal layer M1 may extend in the second direction D2 to be parallel to each other.

According to an example embodiment of the inventive concepts, a power line, which is used to supply a power to the single height cell SHC, may be provided in the form of the lower power line VPR1, VPR2, or VPR3 and may be buried in the substrate 100. Thus, the power line may be omitted from the first metal layer M1. The first interconnection lines M1_I, which are used for signal transmission, may be disposed in the first metal layer M1.

The first metal layer M1 may further include first vias VI1. The first vias VI1 may be respectively provided below the first interconnection lines M1_I of the first metal layer M1. The first interconnection line M1_I of the first metal layer M1 may be electrically connected to the active contact AC through the first via VI1. The first interconnection line M1_I of the first metal layer M1 may be electrically connected to the gate contact GC through the first via VI1.

The first interconnection line M1_I of the first metal layer M1 and the first via VI1 thereunder may be separately formed by different processes. That is, each of the first interconnection line M1_I and the first via VI1 of the first metal layer M1 may be formed by a single damascene process. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that extends in the first direction D1. In other words, the second interconnection lines M2_I may be extended in the first direction D1 to be parallel to each other.

The second metal layer M2 may further include second vias VI2, which are respectively provided below the second interconnection lines M2_I. The first interconnection line M1_I of the first metal layer M1 and the second interconnection line M2_I of the second metal layer M2 may be electrically connected to each other through the second via VI2. In an example embodiment, the second interconnection line M2_I of the second metal layer M2 and the second via VI2 thereunder may be formed by a dual damascene process.

The first interconnection line M1_I of the first metal layer M1 and the second interconnection line M2_I of the second metal layer M2 may be formed of or include the same conductive material or different conductive materials. For example, the first interconnection line M1_I of the first metal layer M1 and the second interconnection line M2_I of the second metal layer M2 may be formed of or include at least one of metallic materials (e.g., aluminum, copper, tungsten, molybdenum, ruthenium, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Figure 12A:
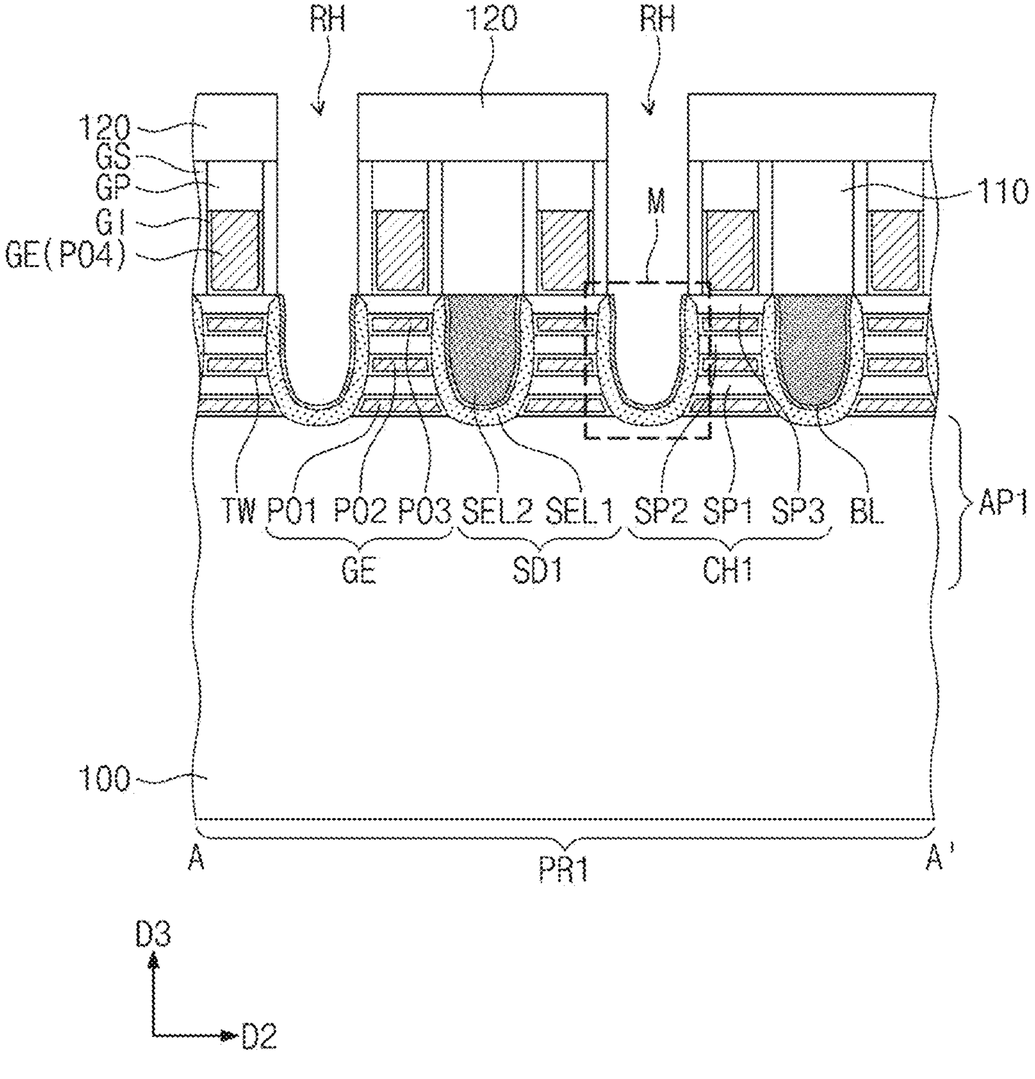
Figure 12B:
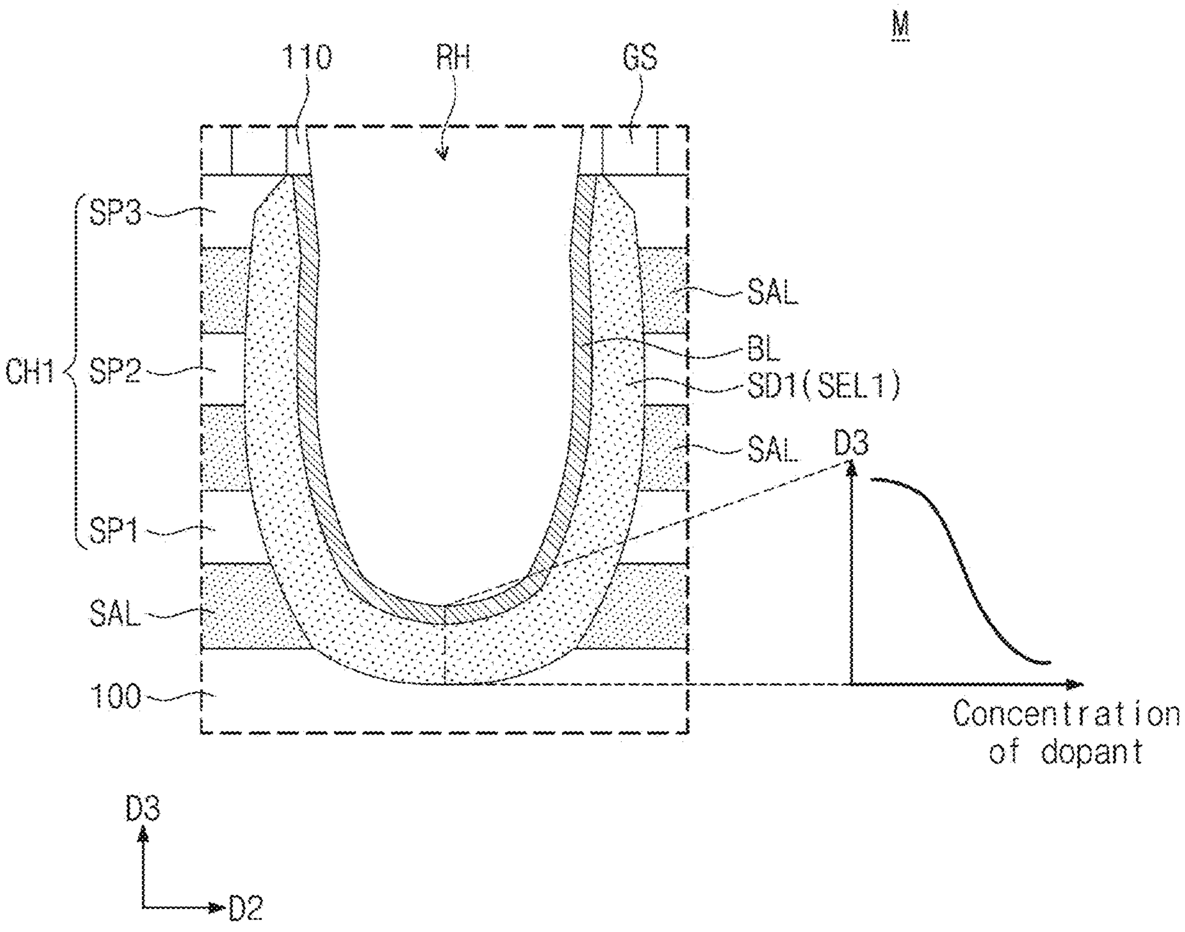
Figure 13A:
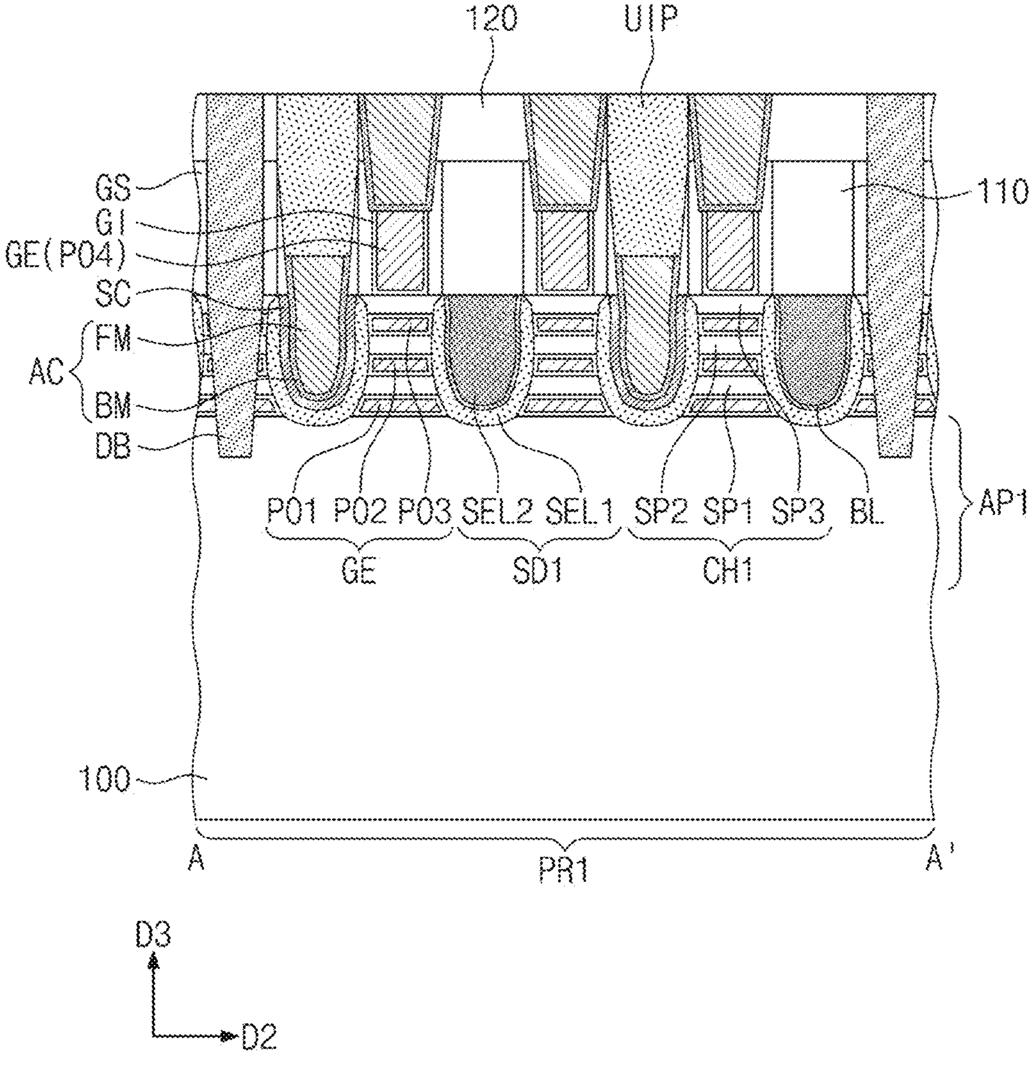
Figure 13B:
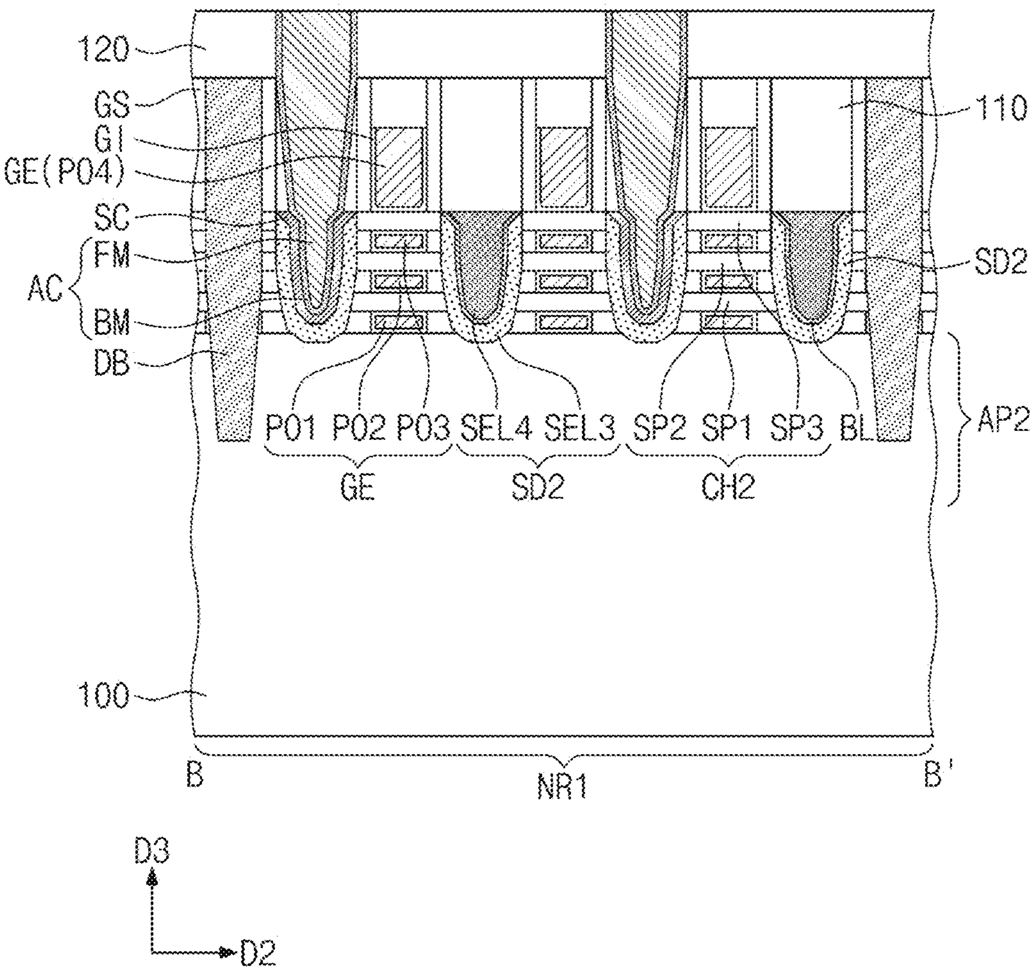
Figure 13C:
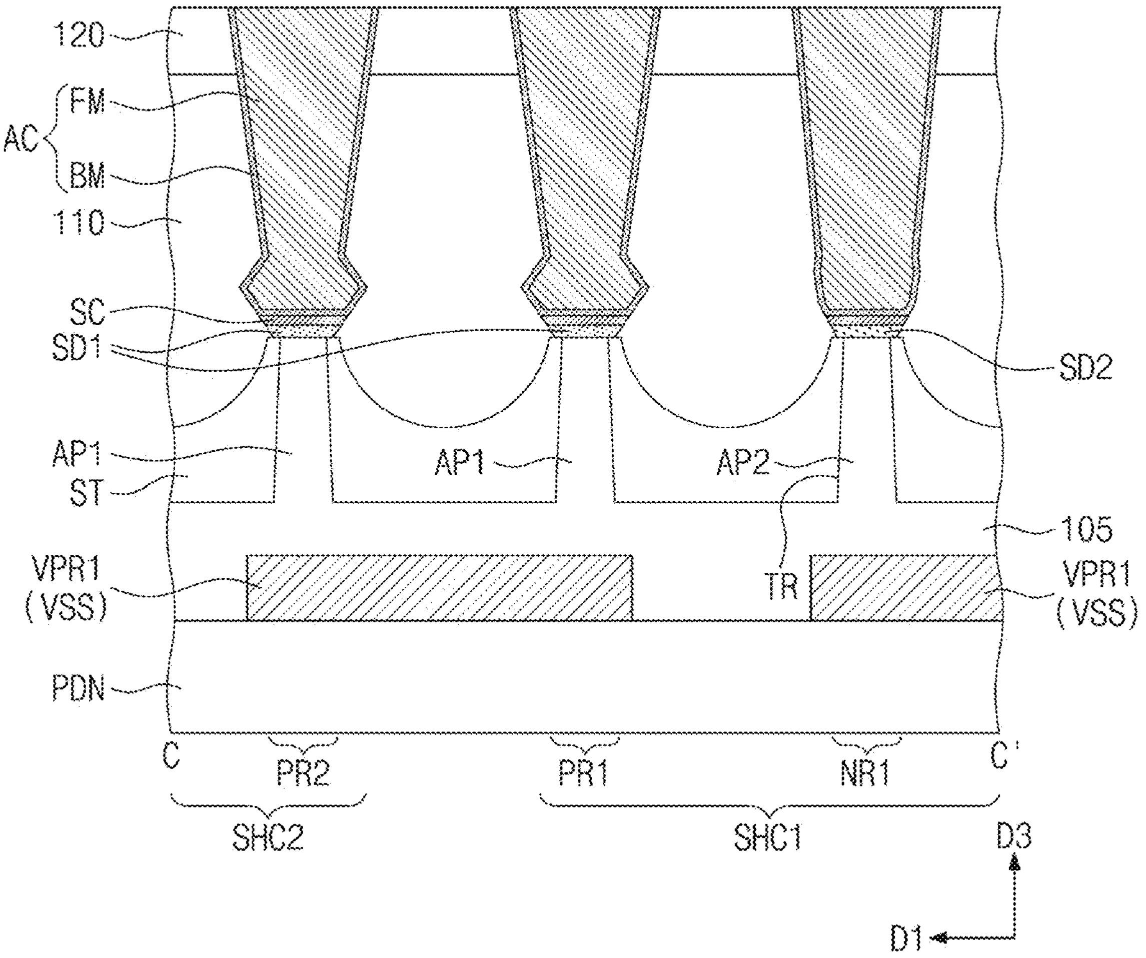
Figure 13D:
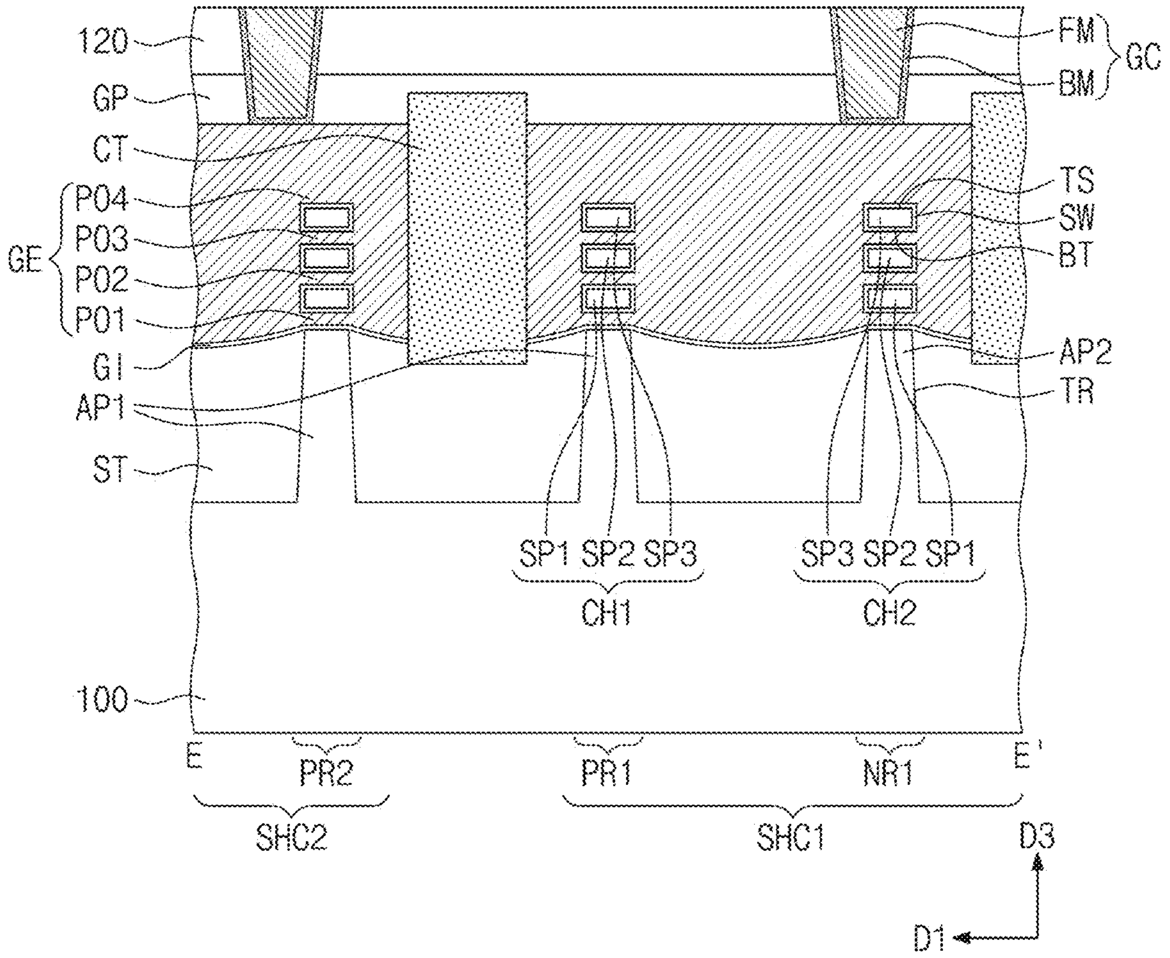

FIGS. 6A to 19 are sectional views illustrating a method of fabricating a semiconductor device according to an example embodiment of the inventive concepts. For example, FIGS. 6A, 7A, 8A, 9A, 10A, 11, 12A, 13A, 14A, 16, 17A, 18, and 20 are sectional views taken along the line A-A' of FIG. 4. FIGS. 6B, 7B, 8B, 9B, 10B, and 13B are sectional views taken along the line B-B' of FIG. 4. FIGS. 8C, 9C, and 13C are sectional views taken along the line C-C' of FIG. 4. FIGS. 15, 17B, and 19 is sectional views taken along the line D-D' of FIG. 4. FIGS. 10C and 13D are sectional views taken along the line E-E' of FIG. 4.

Figure 6A:
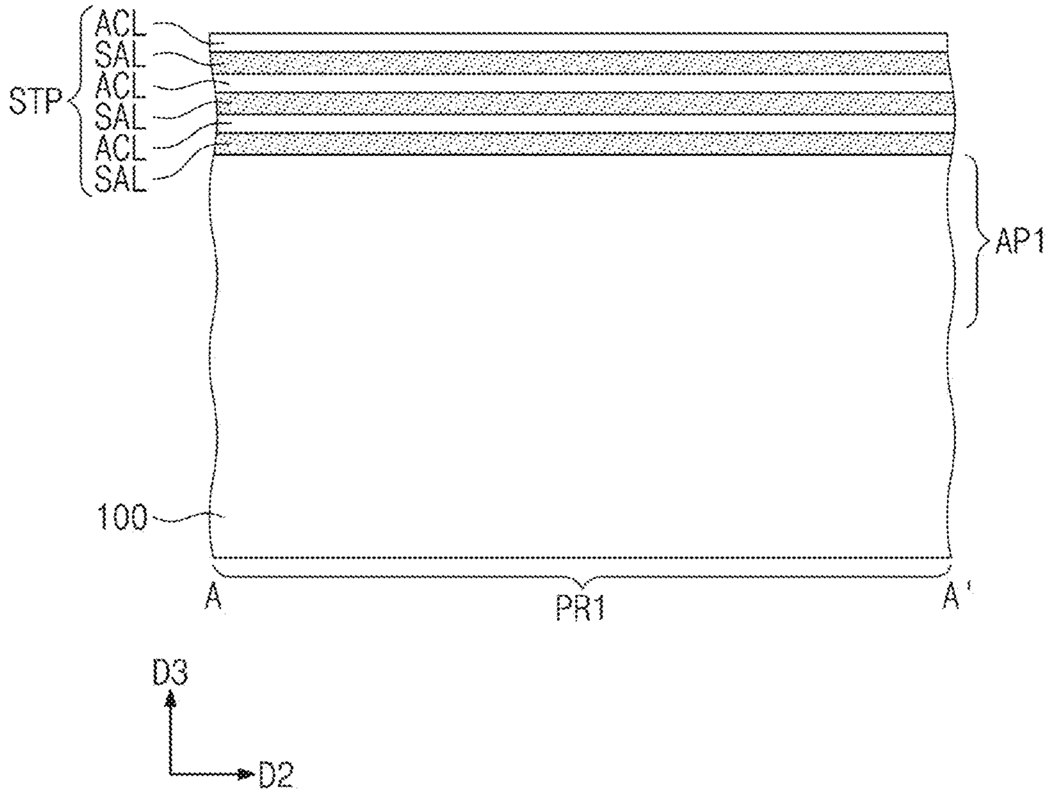
FIGS. 6A to 19 are sectional views illustrating a method of fabricating a semiconductor device according to an example embodiment of the inventive concepts.
Figure 6B:
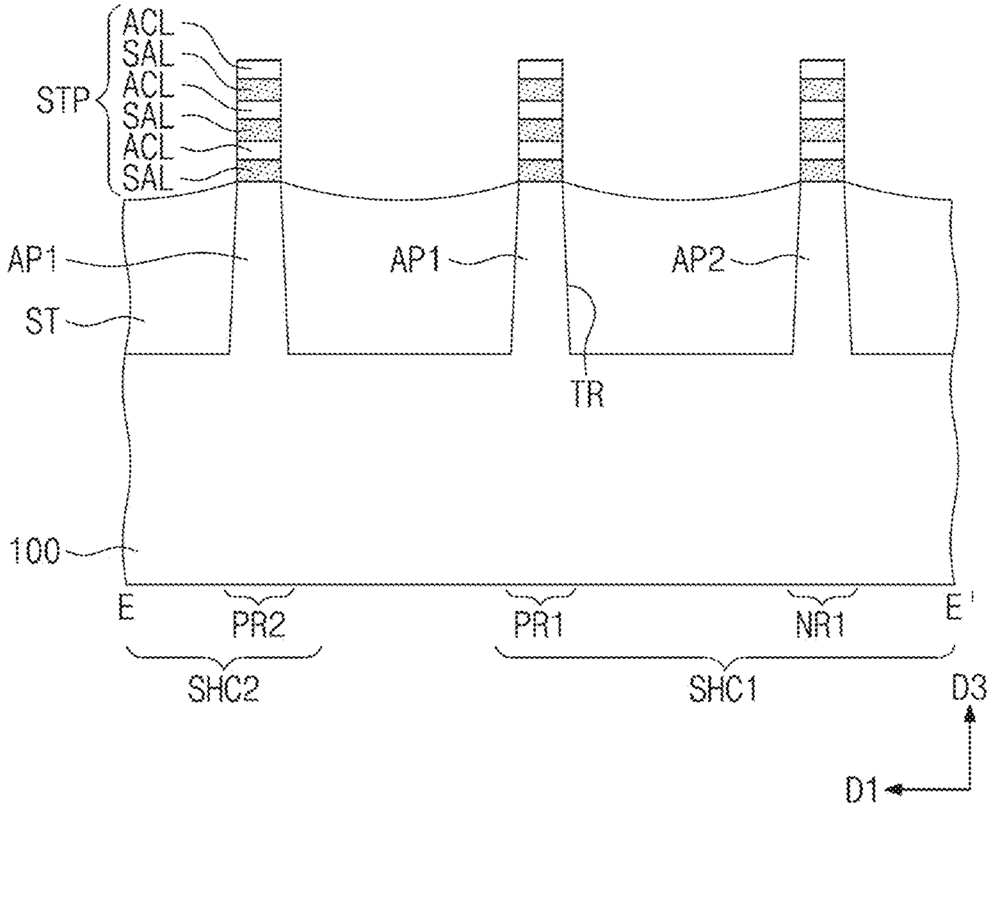

Referring to FIGS. 6A and 6B, a semiconductor substrate 100 including the first and second PMOSFET regions PR1 and PR2 and the first and second NMOSFET regions NR1 and NR2 may be provided. In example an embodiment, the semiconductor substrate 100 may be a silicon wafer. First semiconductor layers ACL and the second semiconductor layers SAL may be formed on the semiconductor substrate 100 to be alternately stacked on top of each other. Each of the first and second semiconductor layers ACL and SAL may be formed of or include at least one of silicon (Si), germanium (Ge), or silicon-germanium (SiGe), but the first and second semiconductor layers ACL and SAL may be formed of different materials from each other.

The second semiconductor layer SAL may be formed of or include a material that is chosen to have an etch selectivity with respect to the first semiconductor layer ACL. For example, the first semiconductor layers ACL may be formed of or include silicon (Si), and the second semiconductor layers SAL may be formed of or include silicon-germanium (SiGe).

Mask patterns may be formed on the first and second PMOSFET regions PR1 and PR2 and the first and second NMOSFET regions NR1 and NR2 of the semiconductor substrate 100, respectively. The mask pattern may be a line- or bar-shaped pattern that is extended in the second direction D2.

A patterning process using the mask patterns as an etch mask may be performed to form the trench TR defining the first and second active patterns AP1 and AP2. The first active pattern AP1 may be formed on each of the first and second PMOSFET regions PR1 and PR2. The second active pattern AP2 may be formed on each of the first and second NMOSFET regions NR1 and NR2. When viewed in a plan view, the first and second active patterns AP1 and AP2 may be line-shaped patterns, which are extended in the second direction D2 to be parallel to each other.

A stacking pattern STP may be formed on each of the first and second active patterns AP1 and AP2. The stacking pattern STP may include the first semiconductor layers ACL and the second semiconductor layers SAL, which are alternately stacked on the semiconductor substrate 100. The stacking pattern STP may be formed along with the first and second active patterns AP1 and AP2, during the patterning process.

The device isolation layer ST may be formed to fill the trench TR. For example, an insulating layer may be formed on the semiconductor substrate 100 to cover (e.g., surround) the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. In other words, the stacking patterns STP may protrude vertically above the device isolation layer ST.

Figure 7A:
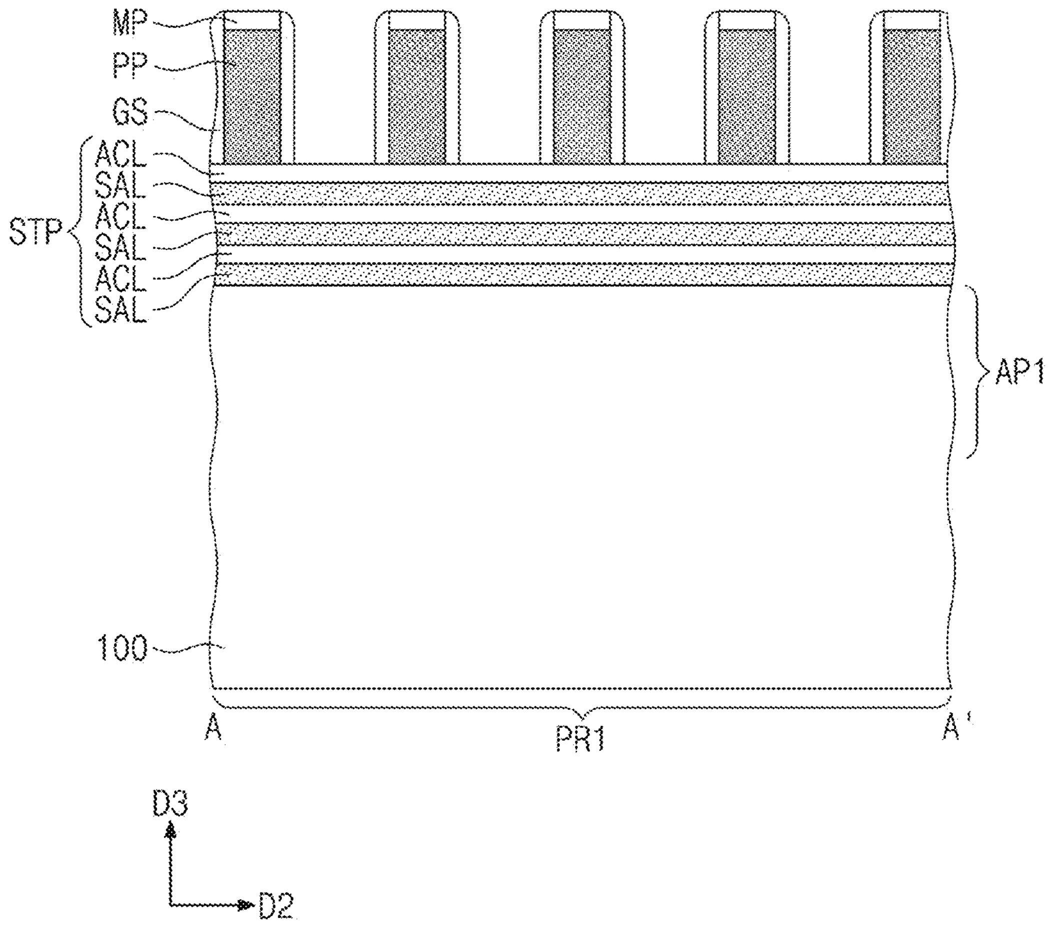
Figure 7B:
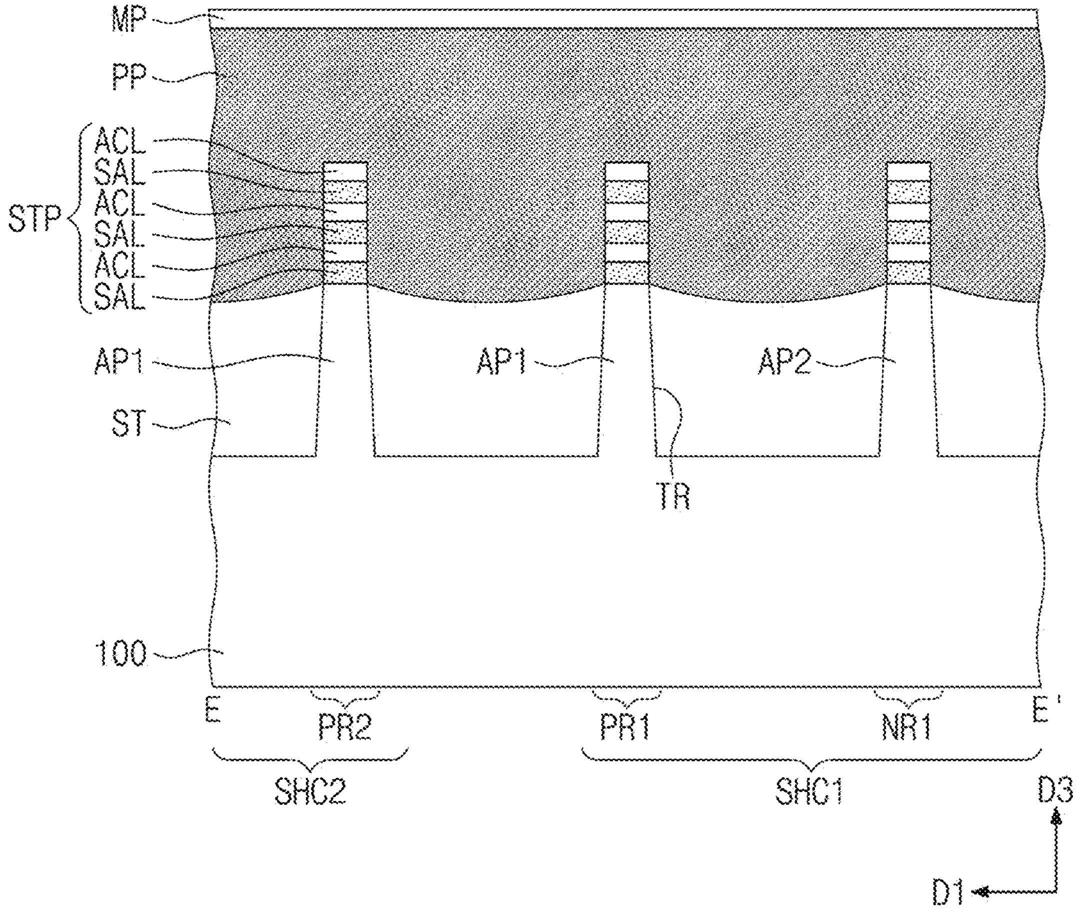

Referring to FIGS. 7A and 7B, sacrificial patterns PP may be formed on the semiconductor substrate 100 to cross the stacking patterns STP. Each of the sacrificial patterns PP may be a line- or bar-shaped pattern extending in the first direction D1. The sacrificial patterns PP may be arranged at a first pitch in the second direction D2.

For example, the formation of the sacrificial patterns PP may include forming a sacrificial layer on the semiconductor substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the semiconductor substrate 100 and anisotropically etching the gate spacer layer. The gate spacer layer may be formed of or include at least one of SiCN, SiCON, or SiN. In an example embodiment, the gate spacer layer may be a multi-layered structure including at least two of SiCN, SiCON, or SiN.

Figure 8A:
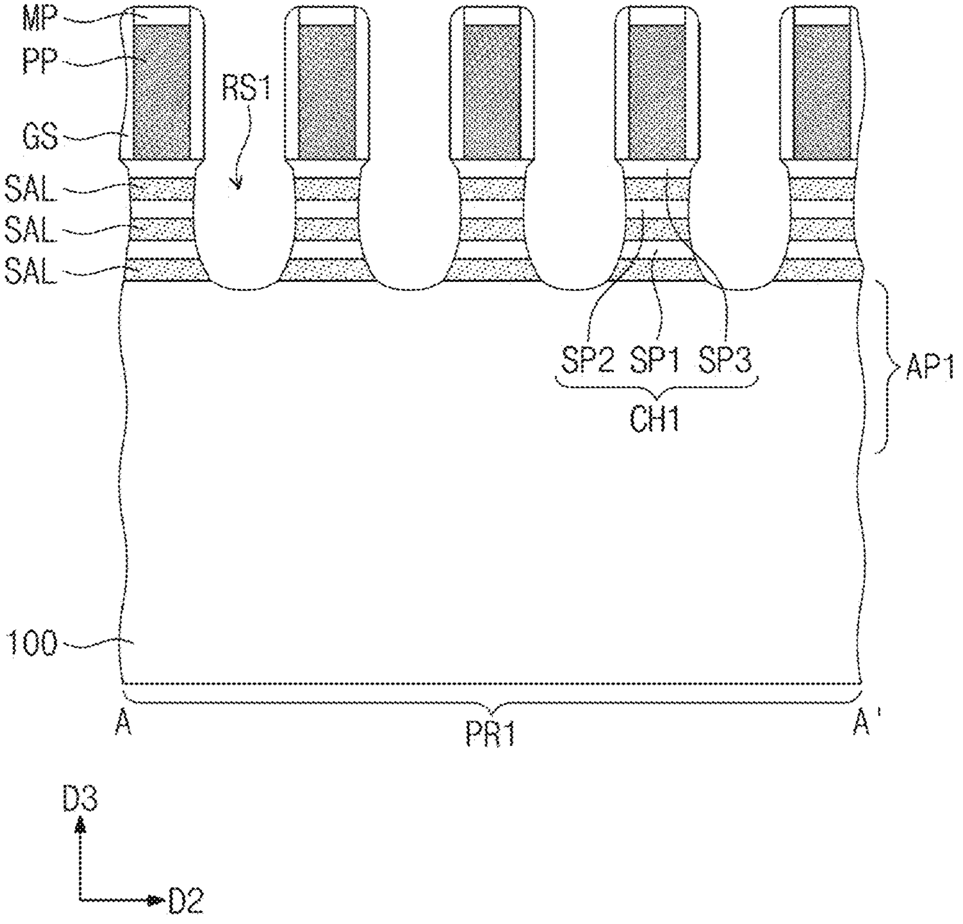
Figure 8B:
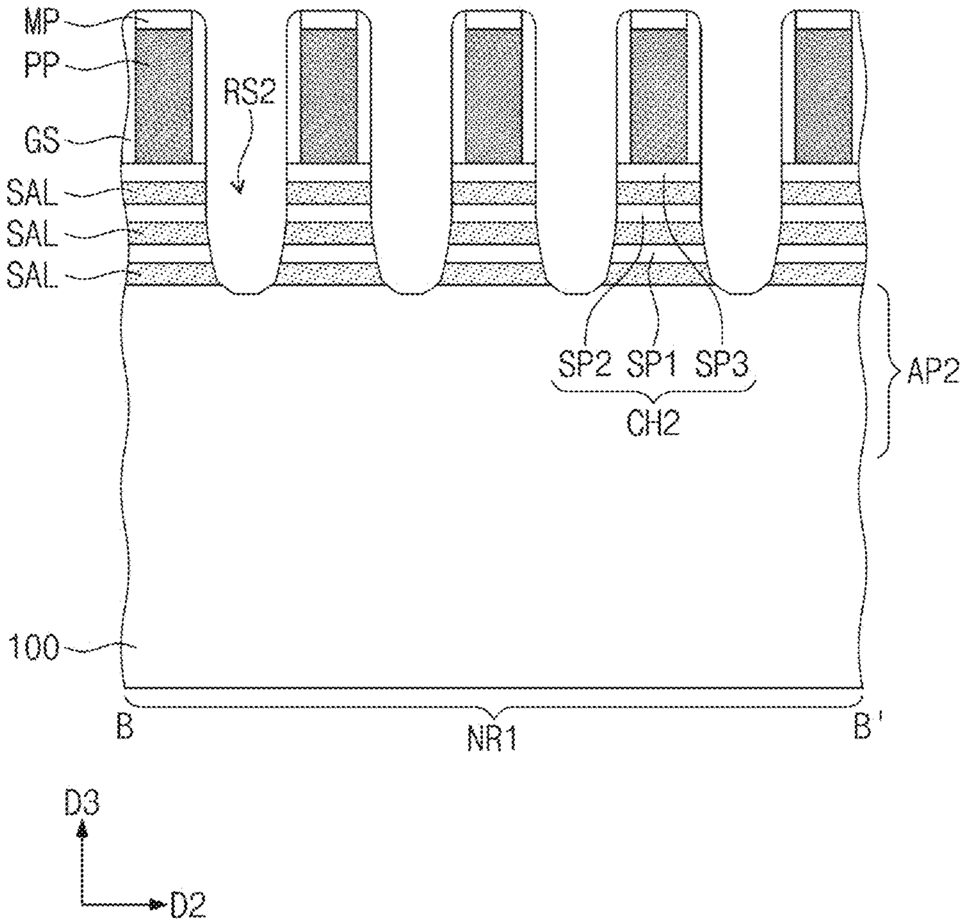
Figure 8C:
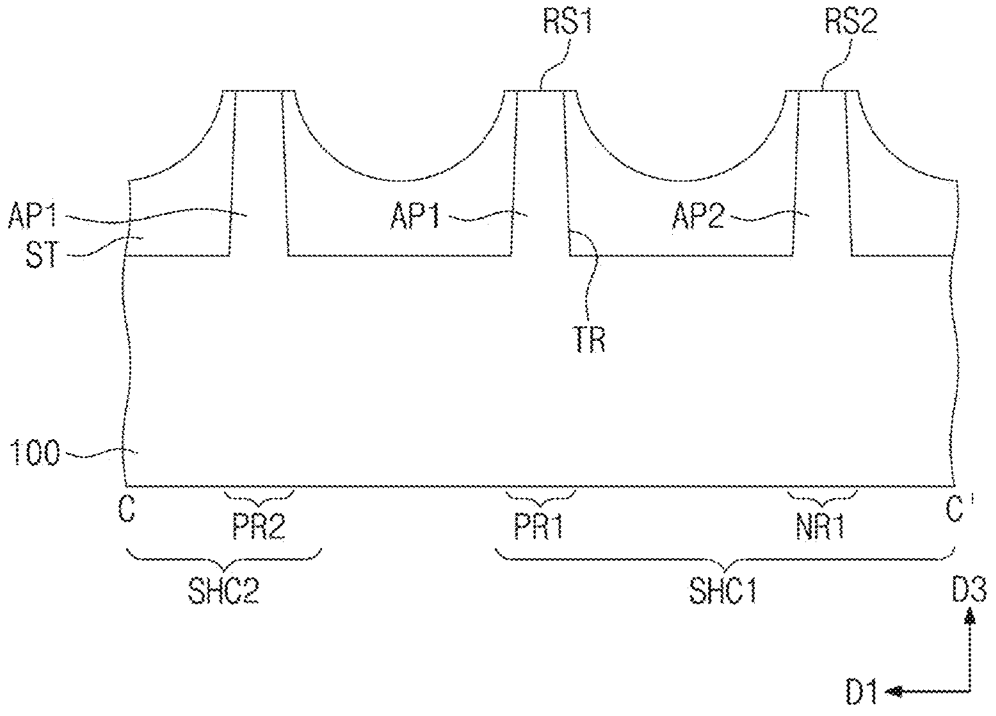

Referring to FIGS. 8A to 8C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 8C).

For example, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP. The second recesses RS2 in the stacking pattern STP on the second active pattern AP2 may be formed by the same method as that for the first recesses RS1.

Referring to FIGS. 8A to 8C, the first to third semiconductor patterns SP1, SP2, and SP3, which are sequentially stacked between adjacent ones of the first recesses RS1, may be formed from the first semiconductor layers ACL, respectively. The first to third semiconductor patterns SP1, SP2, and SP3, which are sequentially stacked between adjacent ones of the second recesses RS2, may be formed from the first semiconductor layers ACL, respectively. The first to third semiconductor patterns SP1, SP2, and SP3 between adjacent ones of the first recesses RS1 may constitute the first channel pattern CH1. The first to third semiconductor patterns SP1, SP2, and SP3 between adjacent ones of the second recesses RS2 may constitute the second channel pattern CH2.

Figure 9A:
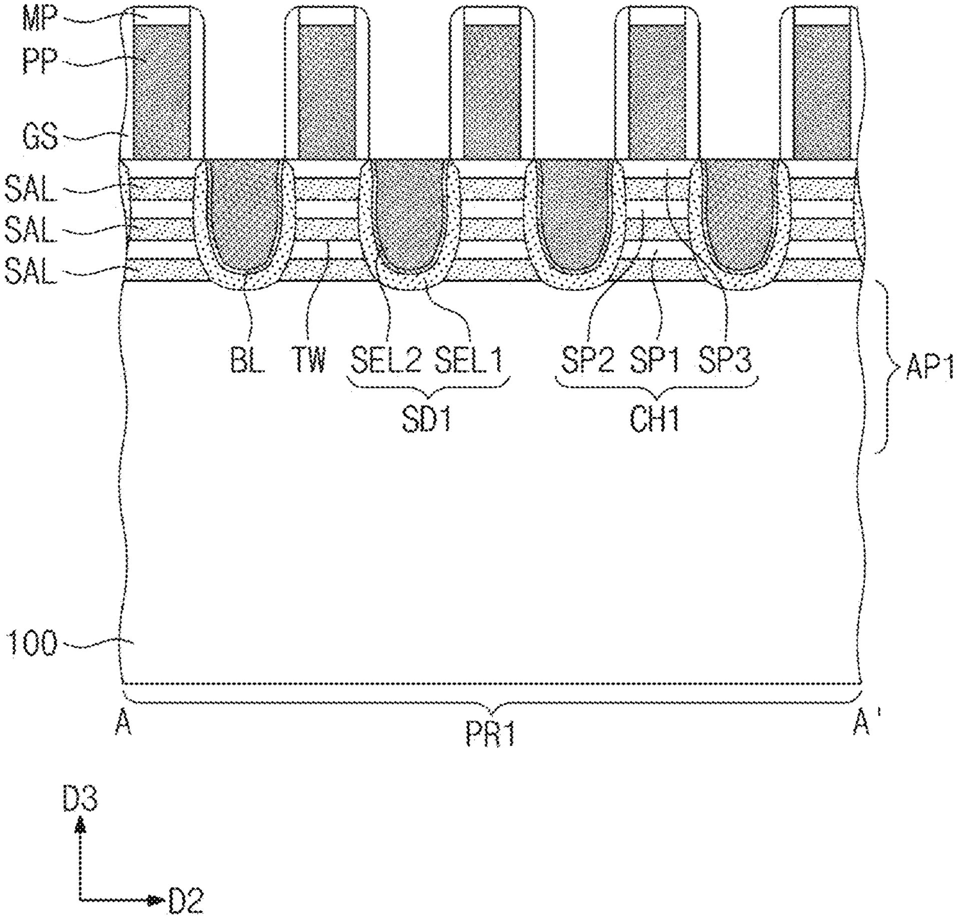
Figure 9B:
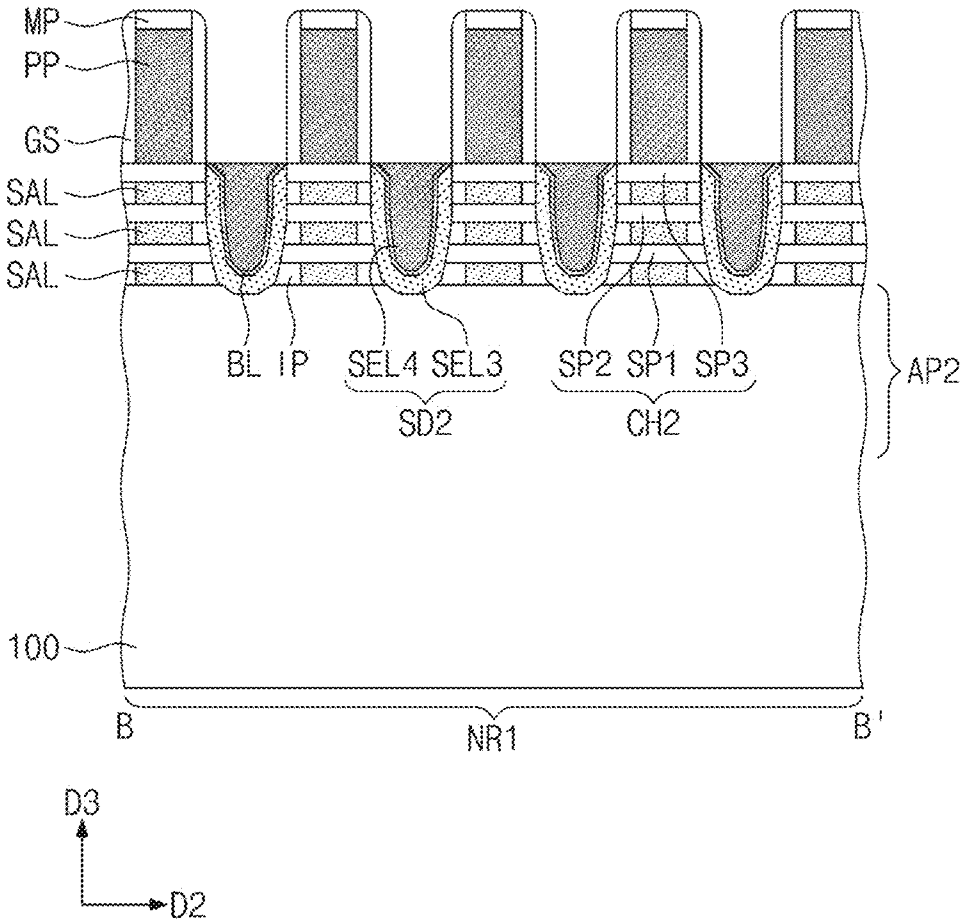
Figure 9C:
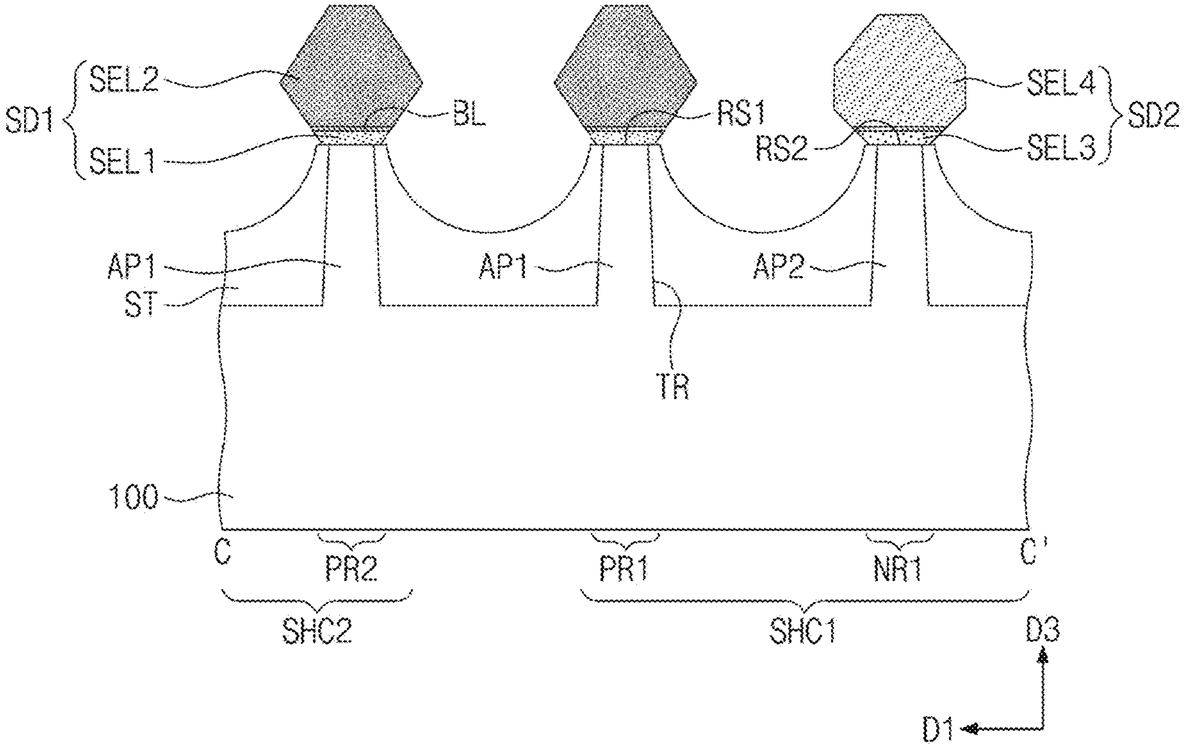

Referring to FIGS. 9A and 9C, the first source/drain patterns SD1 may be formed in the first recesses RS1, respectively. The first source/drain pattern SD1 may include a first layer SEL1 and a second layer SEL2 on the first layer SEL1. A blocking layer BL may be formed between the first layer SEL1 and the second layer SEL2. The blocking layer BL may cover side and bottom surfaces of the second layer SEL2. The first layer SEL1 may cover side and bottom surfaces of the blocking layer BL. A mean thickness of the blocking layer BL may be smaller than a mean thickness of the first layer SEL1.

According to an example embodiment of the inventive concepts, the following method may be used to form the first source/drain pattern SD1. First, the first layer SEL1 may be formed by performing a selective epitaxial growth (SEG) process, in which an inner surface of the first recess RS1 is used as a seed layer. The first layer SEL1 may be grown using the first to third semiconductor patterns SP1, SP2, and SP3, the second semiconductor layers SAL, and the semiconductor substrate 100, which are exposed by the first recess RS1, as a seed layer. As an example, the first SEG process may include a chemical vapor deposition (CVD) process or a molecular beam epitaxy (MBE) process. The first layer SEL1 may be formed of or include at least one of silicon (Si) or silicon-germanium (SiGe).

A top surface of the first layer SEL1 may be recessed toward the semiconductor substrate 100. The recessed first layer SEL1 may have a first inner surface (e.g., a top surface of the recessed first layer SEL1). The bottommost portion of the first inner surface may be lower than the top surface TW of the first semiconductor pattern SP1. In an example embodiment, however, the bottommost portion of the first inner surface may be located at a level that is equal to or higher than the top surface TW of the first semiconductor pattern SP1. The recess depth of the first layer SEL1 may be controlled to adjust a vertical length LG1 of the active contact AC, which will be formed in a subsequent step. The recess depth of the first layer SEL1 may be variously controlled in consideration of a desired value of the vertical length LG1 of the active contact AC.

The blocking layer BL may be conformally formed on the first inner surface. The blocking layer BL may be formed of or include at least one of silicon (Si) or silicon-boron (SiB). The mean thickness of the blocking layer BL may range from 1 nm to 5 nm. Although not shown, the blocking layer BL may be omitted. In this case, there may be a difference in germanium concentration between the first and second layers SEL1 and SEL2.

The second layer SEL2 may be formed on the blocking layer BL. The second layer SEL2 may completely fill the first recess RS1. A top surface of the second layer SEL2 may be located at a level that is equal to or higher than a bottom surface of the gate spacer GS. The second layer SEL2 may include at least one of silicon-germanium (SiGe), silicon-germanium-boron (SiGeB), silicon-arsenic (SiAs), silicon-phosphorus (SiP), silicon-arsenic-phosphorus (SiAsP), silicon-carbon (SiC), or silicon-arsenic-carbon (SiAsC). A germanium concentration of the second layer SEL2 may be higher than that of the first layer SEL1. In an example embodiment, the germanium concentration of the second layer SEL2 may range from 30 at % to 70 at %, and the germanium concentration of the first layer SEL1 may range from 0 at % to 30 at %. In another example embodiment, the germanium concentration of the first layer SEL1 may be equal to or lower than the second layer SEL2.

The second source/drain patterns SD2 may be formed in the second recesses RS2, respectively. The second source/drain pattern SD2 may include a third layer SEL3 and a fourth layer SEL4 on the third layer SEL3. The blocking layer BL may be formed between the third layer SEL3 and the fourth layer SEL4. The blocking layer BL may cover side and bottom surfaces of the fourth layer SEL4. The mean thickness of the blocking layer BL may be smaller than a mean thickness of the third layer SEL3. The inner spacers IP may be respectively formed between the second source/drain pattern SD2 and the second semiconductor layers SAL.

For example, the second source/drain pattern SD2 may be formed by the following method. The third layer SEL3 may be formed by a SEG process using an inner surface of the second recess RS2 as a seed layer. The third layer SEL3 may be formed by substantially the same method as that for the first layer SEL1. The third layer SEL3 may be formed of or include at least one of silicon-arsenic (SiAs), silicon-phosphorus (SiP), or silicon (Si).

A top surface of the third layer SEL3 may be recessed toward the substrate 100. The recessed third layer SEL3 may have a second inner surface (e.g., a top surface of the recessed third layer SEL3). The blocking layer BL may be conformally formed on the second inner surface. The blocking layer BL may be formed of or include at least one of silicon-arsenic (SiAs), silicon-phosphorus (SiP), or silicon (Si). The mean thickness of the blocking layer BL may range from 1 nm to 5 nm.

The fourth layer SEL4 may be formed on the blocking layer BL. The fourth layer SEL4 may completely fill the second recess RS2. A top surface of the fourth layer SEL4 may be located at a level that is equal to or higher than the bottom surface of the gate spacer GS. The fourth layer SEL4 may include at least one of silicon-germanium (SiGe), silicon-germanium-boron (SiGeB), silicon-arsenic (SiAs), silicon-phosphorus (SiP), silicon-arsenic-phosphorus (SiAsP), silicon-carbon (SiC), or silicon-arsenic-carbon (SiAsC). As an example, the germanium concentration of the fourth layer SEL4 may range from 1 at % to 70 at %.

In an example embodiment, before the formation of the second source/drain pattern SD2, the inner spacer IP may be formed by replacing a portion of the second semiconductor layer SAL, which is exposed by the second recess RS2, with an insulating material. As a result, the inner spacers IP may be respectively formed between the second source/drain pattern SD2 and the second semiconductor layers SAL.

Figure 10A:
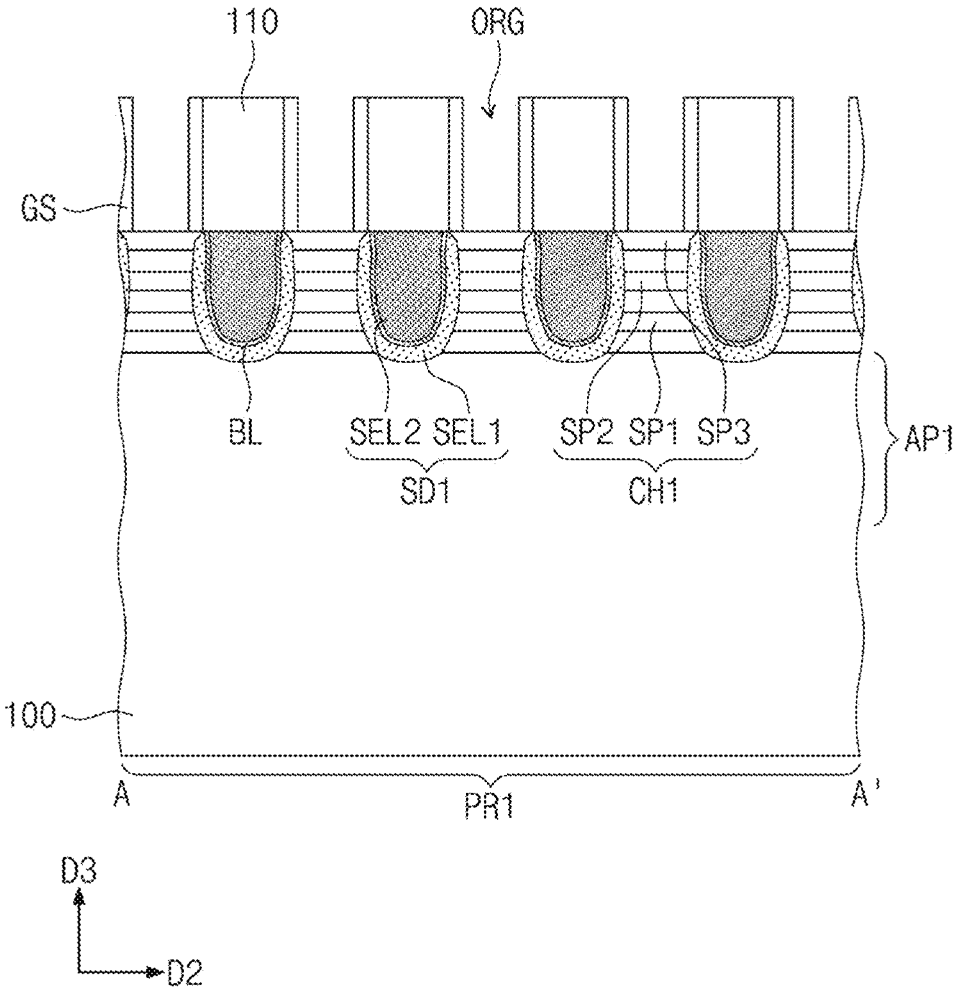
Figure 10B:
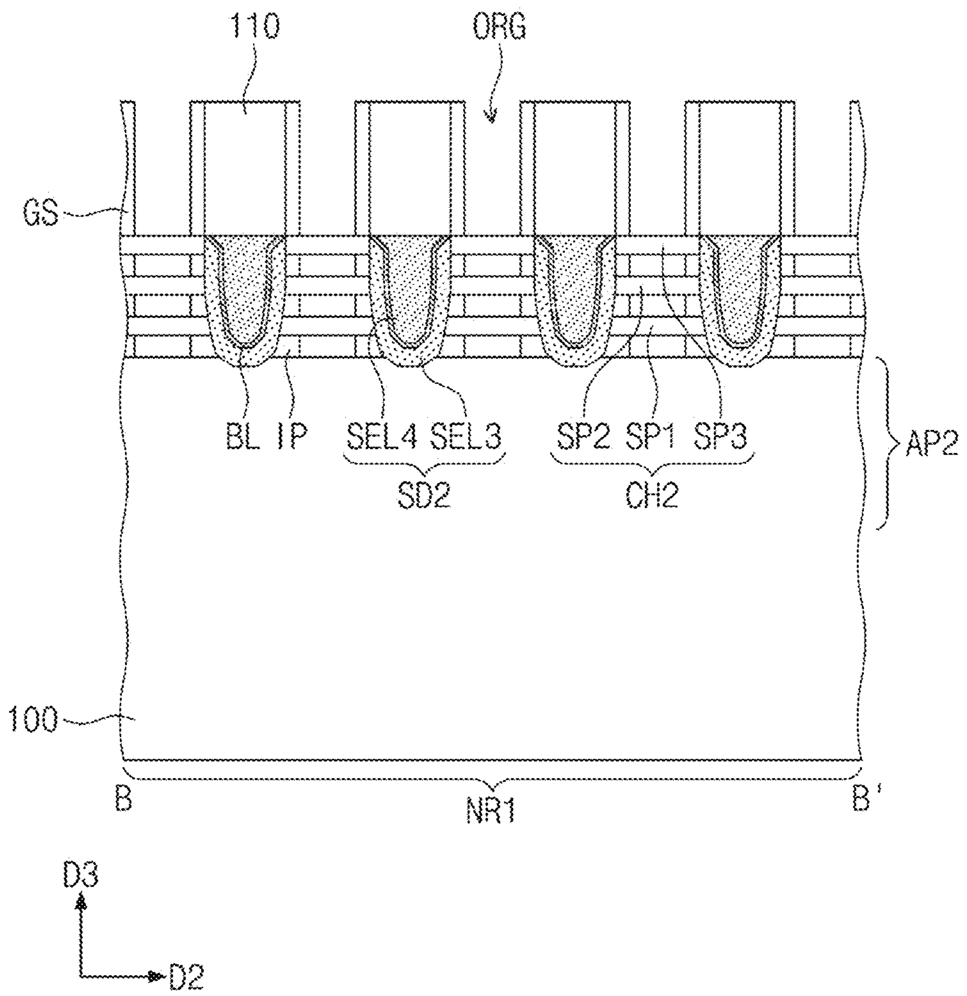
Figure 10C:
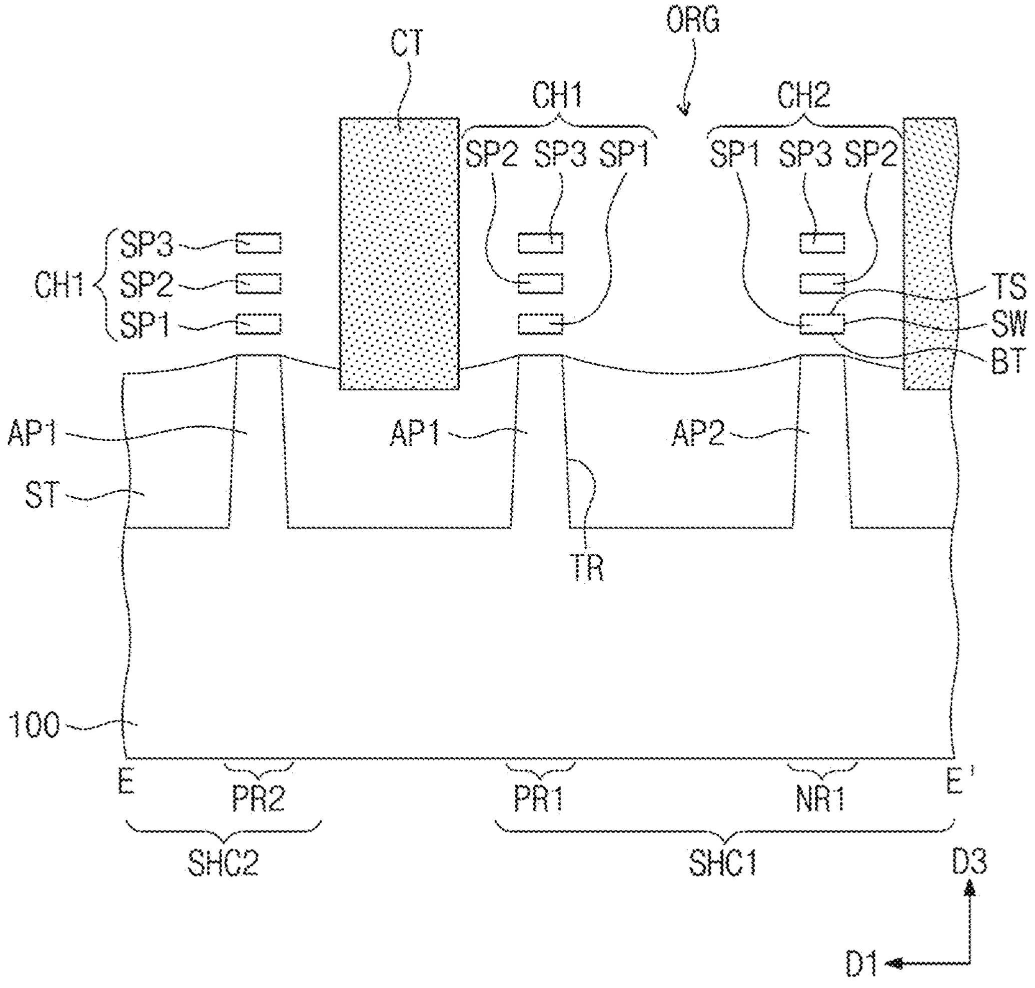

Referring to FIGS. 10A to 10C, the first interlayer insulating layer 110 may be formed to cover the first and second source/drain patterns SD1 and SD2, the hard mask patterns MP, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. The hard mask patterns MP may be fully removed during the planarization process. Thus, a top surface of the first interlayer insulating layer 110 may be coplanar with the top surfaces of the sacrificial patterns PP and the top surfaces of the gate spacers GS.

A photolithography process may be performed to selectively open a region of the sacrificial pattern PP. For example, a region of the sacrificial pattern PP on the third and fourth borders BD3 and BD4 of the first single height cell SHC1 may be selectively opened. The opened region of the sacrificial pattern PP may be selectively etched and removed. The gate cutting pattern CT may be formed by filling a space, which is formed by removing the sacrificial pattern PP, with an insulating material (e.g., see FIG. 10C).

The exposed sacrificial patterns PP may be selectively removed. As a result of the removal of the sacrificial patterns PP, an outer region ORG exposing the first and second channel patterns CH1 and CH2 may be formed (e.g., see FIG. 10C). The removal of the sacrificial patterns PP may include a wet etching process, which is performed using an etching solution capable of selectively etching polysilicon.

The second semiconductor layers SAL exposed through the outer region ORG may be selectively removed to form inner regions IRG. For example, an etching process of selectively etching the second semiconductor layers SAL may be performed to leave the first to third semiconductor patterns SP1, SP2, and SP3 and to remove only the second semiconductor layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

During the etching process, the second semiconductor layers SAL may be completely removed from the first and second PMOSFET regions PR1 and PR2 and the first and second NMOSFET regions NR1 and NR2. The etching process may be a wet etching process. An etchant material, which is used in the etching process, may be chosen to quickly remove the second semiconductor layer SAL having a relatively high germanium concentration.

Referring to FIG. 10C, as a result of the selective removal of the second semiconductor layers SAL, the stacked first to third semiconductor patterns SP1, SP2, and SP3 may be left on each of the first and second active patterns AP1 and AP2. Empty regions, which are formed by removing the second semiconductor layers SAL, may be referred to as first to third inner regions IRG1, IRG2, and IRG3, respectively. For example, the first inner region IRG1 may be formed between the semiconductor substrate 100 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Figure 11:
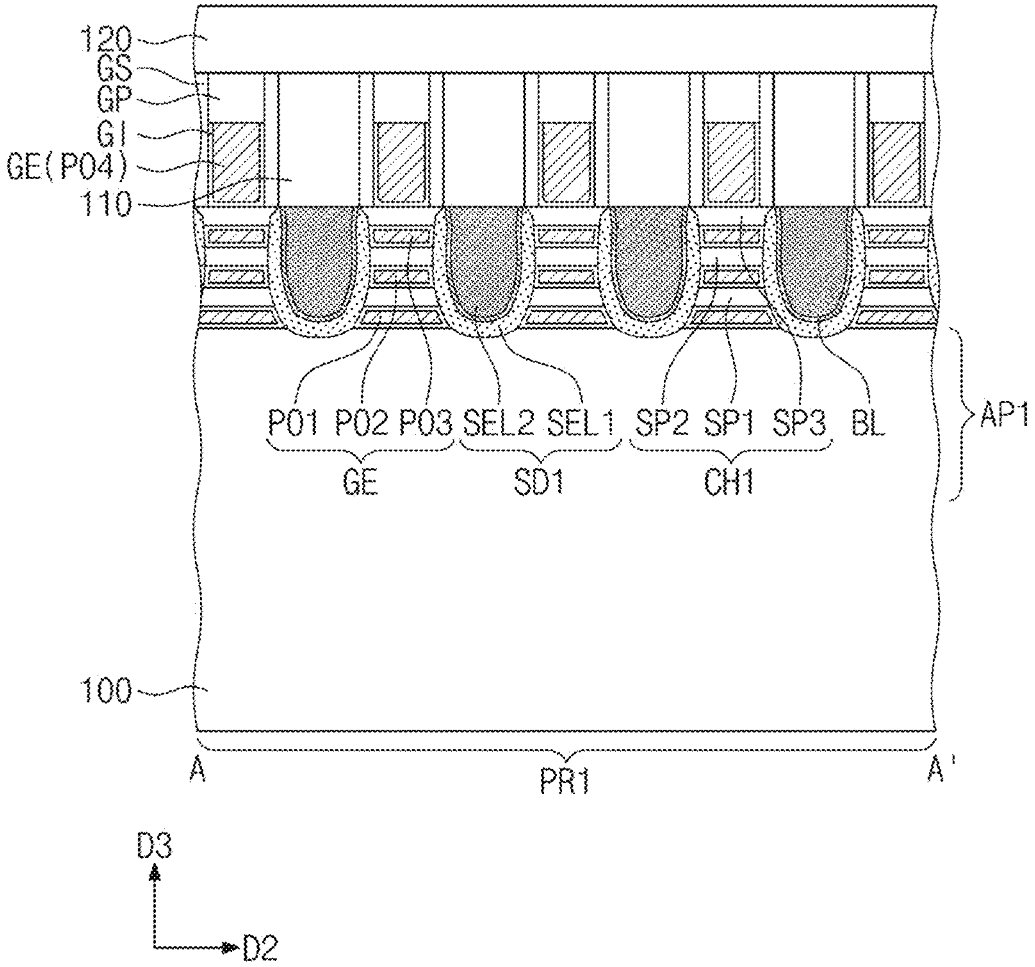

Referring to FIG. 11, the gate insulating layer GI may be conformally formed on the exposed first to third semiconductor patterns SP1, SP2, and SP3. The gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG.

The gate electrode GE may be vertically recessed to have a reduced height. An upper portion of the gate cutting pattern CT may be slightly recessed, during the recessing of the gate electrode GE. The gate capping pattern GP may be formed on the recessed gate electrode GE.

The second interlayer insulating layer 120 may be formed on the first interlayer insulating layer 110. The second interlayer insulating layer 120 may include a silicon oxide layer. The active contact AC may be formed to penetrate the second interlayer insulating layer 120 and the first interlayer insulating layer 110 and to be electrically connected to at least one of the first and second source/drain patterns SD1 and SD2. The gate contact GC may be formed to penetrate the second interlayer insulating layer 120 and the gate capping pattern GP and to be electrically connected to the gate electrode GE.

A method of forming the active contact AC will be described in more detail with reference to FIGS. 12A to 13C. FIG. 12B is an enlarged sectional view illustrating a portion 'M' of FIG. 12A.

The active contact AC may be formed on the first and second active source/drain patterns SD1*a* and SD2*a*. The second and fourth layers SEL2 and SEL4 of the first and second active source/drain patterns SD1*a* and SD2*a* may be selectively removed by a first etching process. The second and fourth layers SEL2 and SEL4 may be formed of or include a material having an etch selectivity with respect to the blocking layer BL. For example, the second layer SEL2 may be formed of or include silicon germanium (SiGe), and the blocking layer BL may be formed of or include silicon (Si). A portion of the first interlayer insulating layer 110 may be removed by the first etching process. The second layer SEL2, the fourth layer SEL4, and a portion of the first interlayer insulating layer 110 may be removed to form a recess hole RH exposing the blocking layer BL and the first interlayer insulating layer 110. The bottommost surface of the recess hole RH may be lower than the top surface TW of the first semiconductor pattern SP1.

The first etching process may be a wet etching process or a dry etching process. The dry etching process may be performed using a process gas containing at least one of fluorine ($F_2$), chlorine ($Cl_2$), or hydrogen chloride (HCl), and the wet etching process may be performed using solution containing at least one of hydrogen peroxide ($H_2O_2$), acetic acid ($CH_3COOH$), or hydrogen fluoride (HF).

Although not shown, the blocking layer BL may be omitted. Here, the first layer SEL1 may have an etch selectivity with respect to the second layer SEL2, and the third layer SEL3 may have an etch selectivity with respect to the fourth layer SEL4. As an example, the first layer SEL1 may include a low concentration of silicon germanium (SiGe), and the second layer SEL2 may include a high concentration of silicon germanium (SiGe). A germanium concentration of the first layer SEL1 may range from 0 at % to 30 at %, and a germanium concentration of the second layer SEL2 may range from 30 at % to 70 at %. The difference of the germanium concentration may allow for selective removal of the second layer SEL2. In an embodiment, the third layer SEL3 may include silicon-phosphorus (SiP), and the fourth layer SEL4 may include silicon-germanium (SiGe).

Impurities may be injected into the blocking layer BL and the first and second active source/drain patterns SD1*a* and SD2*a*. The impurities may be injected into the blocking layer BL by a plasma doping (PLAD) method. For example, under plasma environment, impurity ions may be injected into the blocking layer BL and the first and second active source/drain patterns SD1*a* and SD2*a*. In the case where the blocking layer BL is omitted, the impurities may be directly injected into an inner surface of the first and second active source/drain patterns SD1*a* and SD2*a*. The impurities of the first active source/drain pattern SD1*a* may include at least one of boron (B), gallium (Ga), or indium (In). The impurities of the second active source/drain pattern SD2*a* may include at least one of arsenic (As), phosphorus (P), or antimony (Sb). In an example embodiment, the impurities may be injected into the blocking layer BL through a pre-amorphization implantation (PAI) process. Here, the impurities may include at least one of argon (Ar) and germanium (Ge).

The impurity concentration of the blocking layer BL may be higher than that of the first and second active source/drain patterns SD1*a* and SD2*a*. The smaller the distance to the blocking layer BL, the higher the impurity concentrations of the first and second active source/drain patterns SD1*a* and SD2*a*. As a result of the injection of the impurities, a contact resistance between the active contact AC and the first and second active source/drain patterns SD1*a* and SD2*a* may be lowered.

The active contacts AC may be formed to penetrate the second interlayer insulating layer 120 and the first interlayer insulating layer 110 and to be electrically connected to the first and second active source/drain patterns SD1*a* and SD2*a*. The silicide layer SC may be formed between the active contact AC and the first and second active source/drain patterns SD1*a* and SD2*a*.

For example, the silicide layer SC may be formed by depositing a metallic material on the blocking layer BL exposed by the recess hole RH. The metallic material may include at least one of titanium, tantalum, tungsten, nickel, or cobalt. The deposition of the metallic material may include a chemical vapor deposition (CVD) process.

The active contact AC may be formed on the silicide layer SC. The formation of the active contact AC may include forming the barrier pattern BM and forming the conductive pattern FM on the barrier pattern BM. The barrier pattern BM may be conformally formed and may include a metal layer and/or a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CON), or platinum nitride (PtN). The conductive pattern FM may be formed of or include a low resistance metal. For example, the conductive pattern FM may be formed of or include at least one metal of aluminum, copper, tungsten, molybdenum, or cobalt.

Referring to FIG. 13D, the gate contact GC may be formed to penetrate the second interlayer insulating layer 120 and the gate capping pattern GP and to be electrically connected to the gate electrode GE. The formation of the gate contact GC may be substantially the same as the formation of the active contact AC.

The division structures DB may be respectively formed on the first and second borders BD1 and BD2 of the single height cell SHC. The division structure DB may penetrate the second interlayer insulating layer 120 and the gate electrode GE and may extend into the active pattern AP1 or AP2. The division structure DB may be formed of or include an insulating material (e.g., silicon oxide or silicon nitride).

Figure 14:
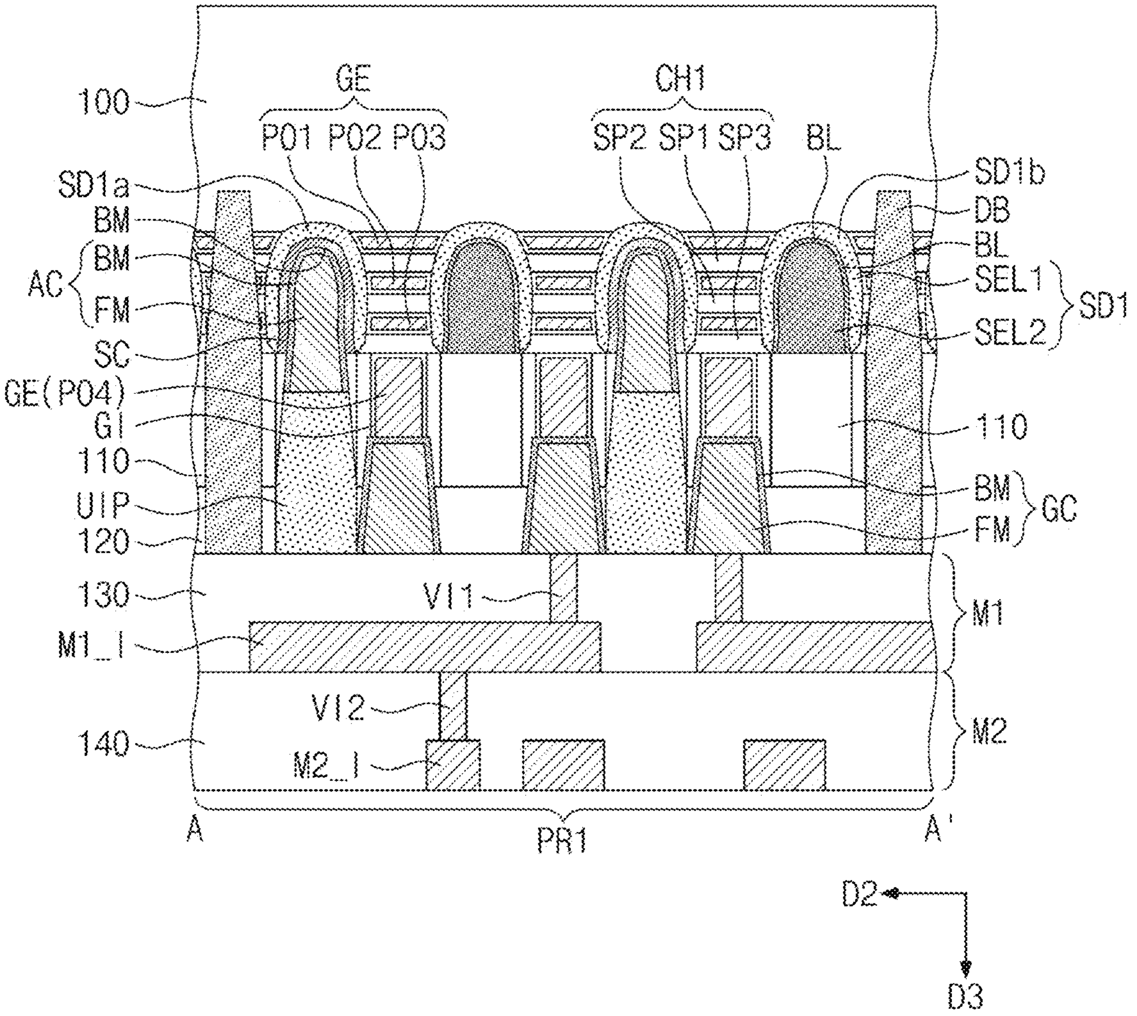
Figure 15:
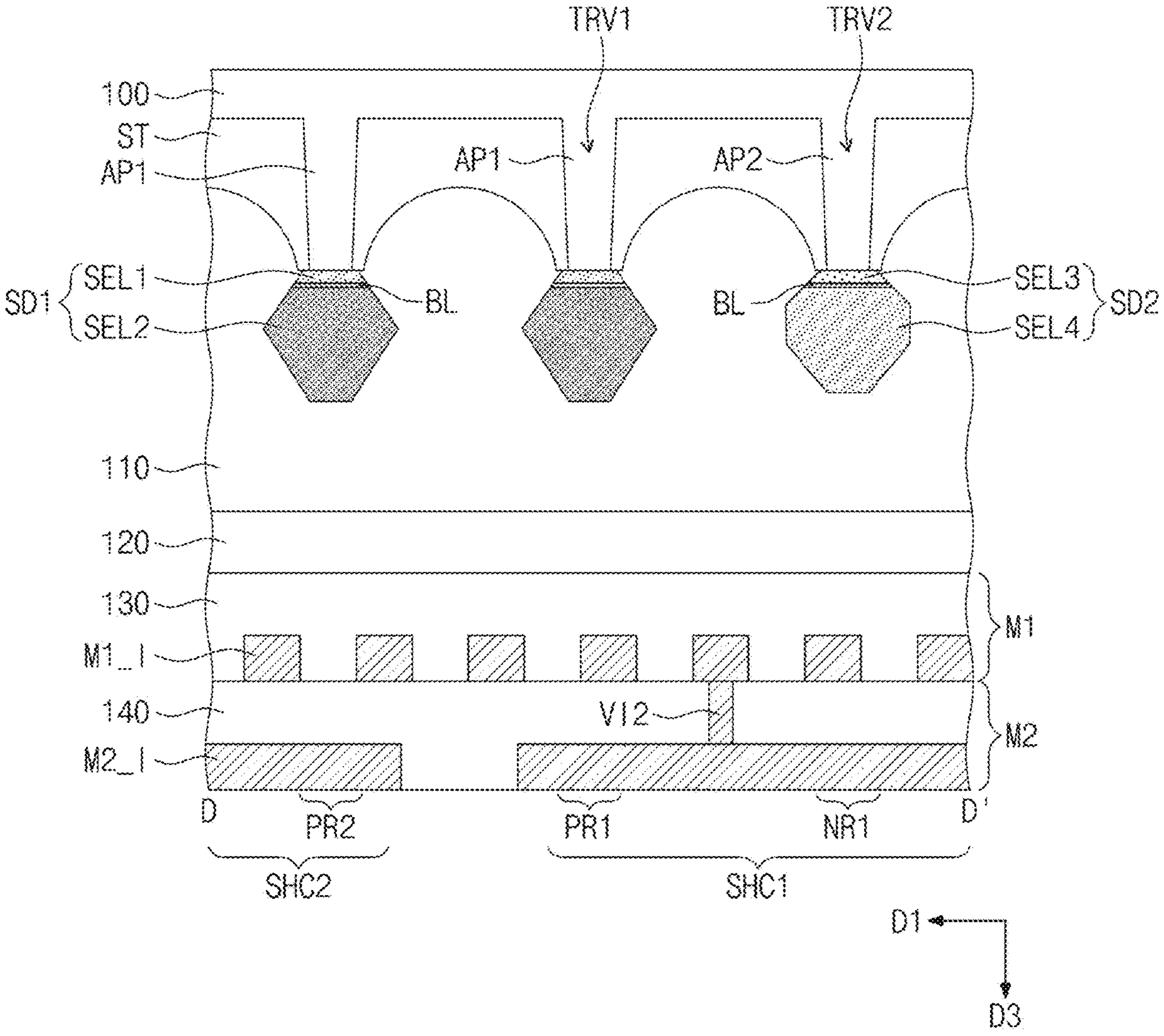

Referring to FIGS. 14 and 15, after a BEOL process is finished, the semiconductor substrate 100 may be inverted such that a bottom surface of the semiconductor substrate 100 is exposed to the outside.

Figure 16:
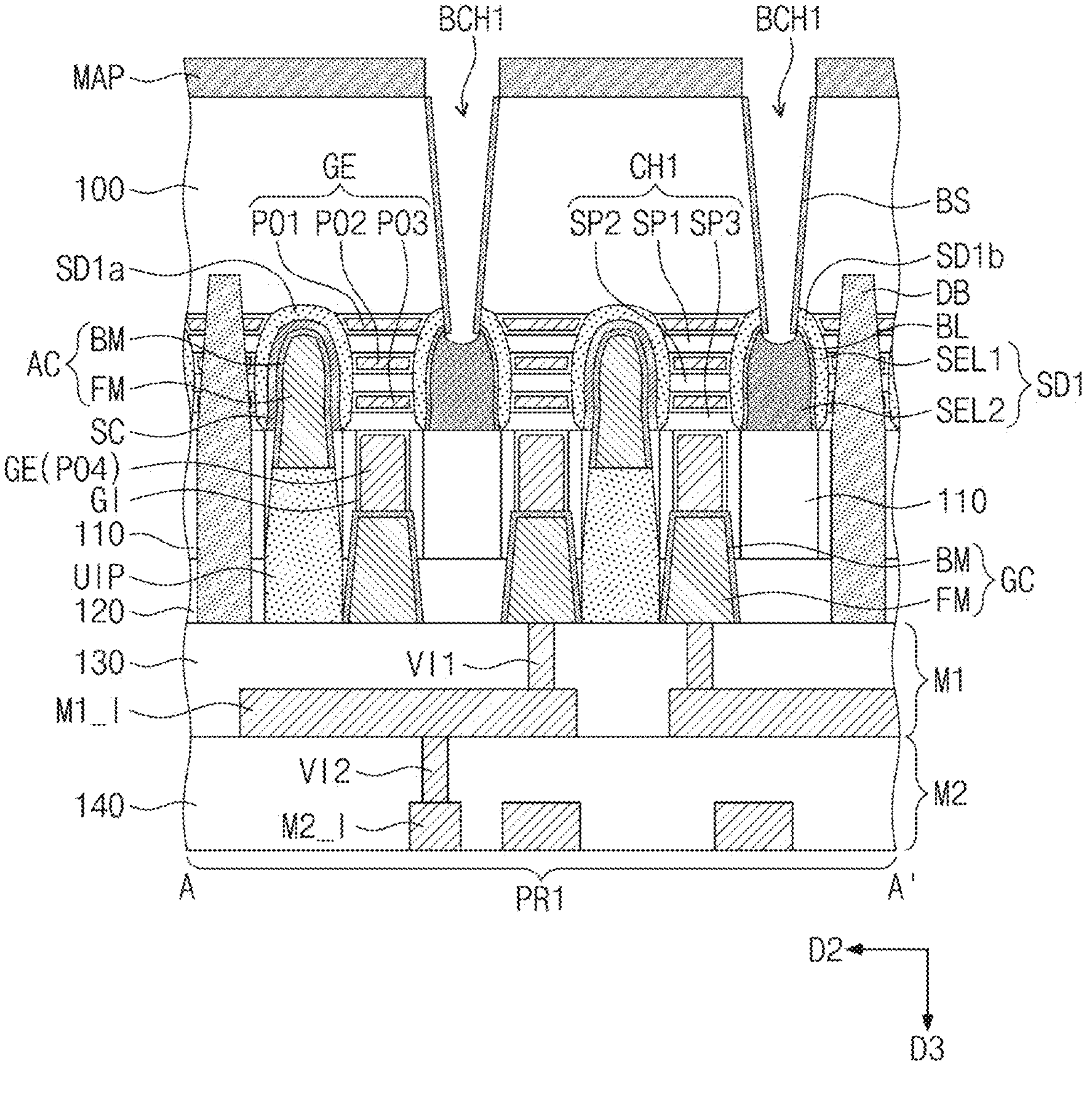

Referring to FIG. 16, a silicon grinding process and a chemical mechanical polishing (CMP) process may be performed on the semiconductor substrate 100 to reduce a thickness of the semiconductor substrate 100. For example, the thickness of the semiconductor substrate 100 of FIG. 16 may be reduced to a value smaller than the thickness of the semiconductor substrate 100 of FIG. 14. First and second back-side contact holes BCH1 and BCH2 may be formed in the semiconductor substrate 100 with the reduced thickness. For example, a mask pattern MAP may be formed on the semiconductor substrate 100. The mask pattern MAP may be formed through a photolithography process. The first and second back-side contact holes BCH1 and BCH2 may be formed by performing an anisotropic etching process on the semiconductor substrate 100 using the mask pattern MAP as an etch mask. Each of the first and second back-side contact holes BCH1 and BCH2 may be shaped like a circular pillar whose diameter decreases as a distance to the first and second back-side source/drain patterns SD1*b* and SD2*b* decreases.

The first back-side contact hole BCH1 may be formed to expose the first back-side source/drain pattern SD1*b*. The second back-side contact hole BCH2 may be formed to expose the second back-side source/drain pattern SD2*b*. For example, the first back-side contact hole BCH1 may be formed to penetrate the first layer SEL1 of the first back-side source/drain pattern SD1*b* and expose the second layer SEL2 of the first back-side source/drain pattern SD1*b*. The second back-side contact hole BCH2 may be formed to penetrate the third layer SEL3 of the second back-side source/drain pattern SD2*b* and expose the fourth layer SEL4 of the second back-side source/drain pattern SD2*b*. The first and second back-side source/drain patterns SD1*b* and SD2*b* may be partially removed through the anisotropic etching process.

The back-side spacer BS may be formed on an inner surface of each of the first and second back-side contact holes BCH1 and BCH2. The back-side spacer BS may be formed in the form of a spacer. The back-side spacer BS may be formed of or include at least one of silicon-based insulating materials (e.g., SiO, SiN, SiOC, and SiOCN).

Figure 17A:
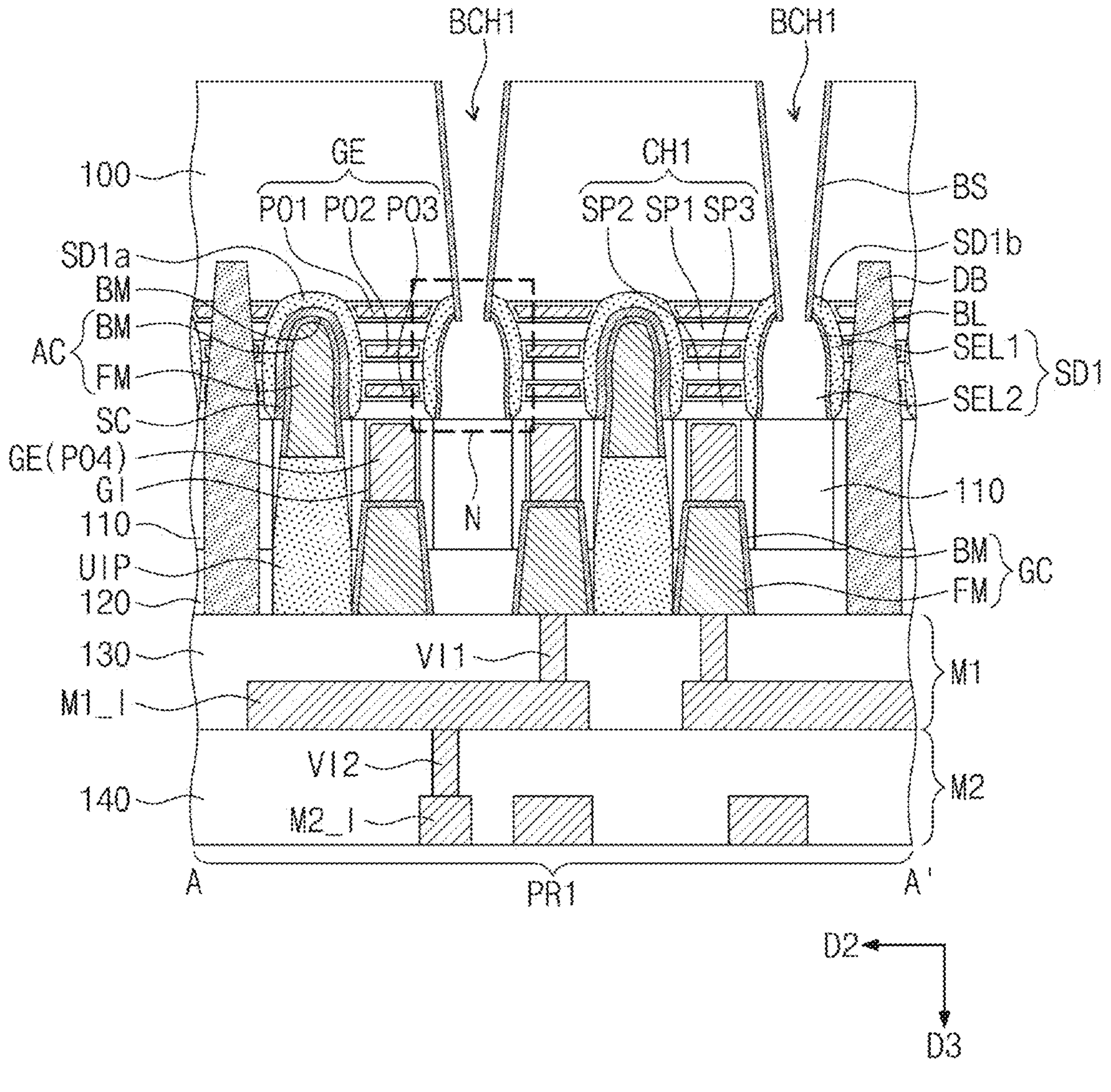
Figure 17B:
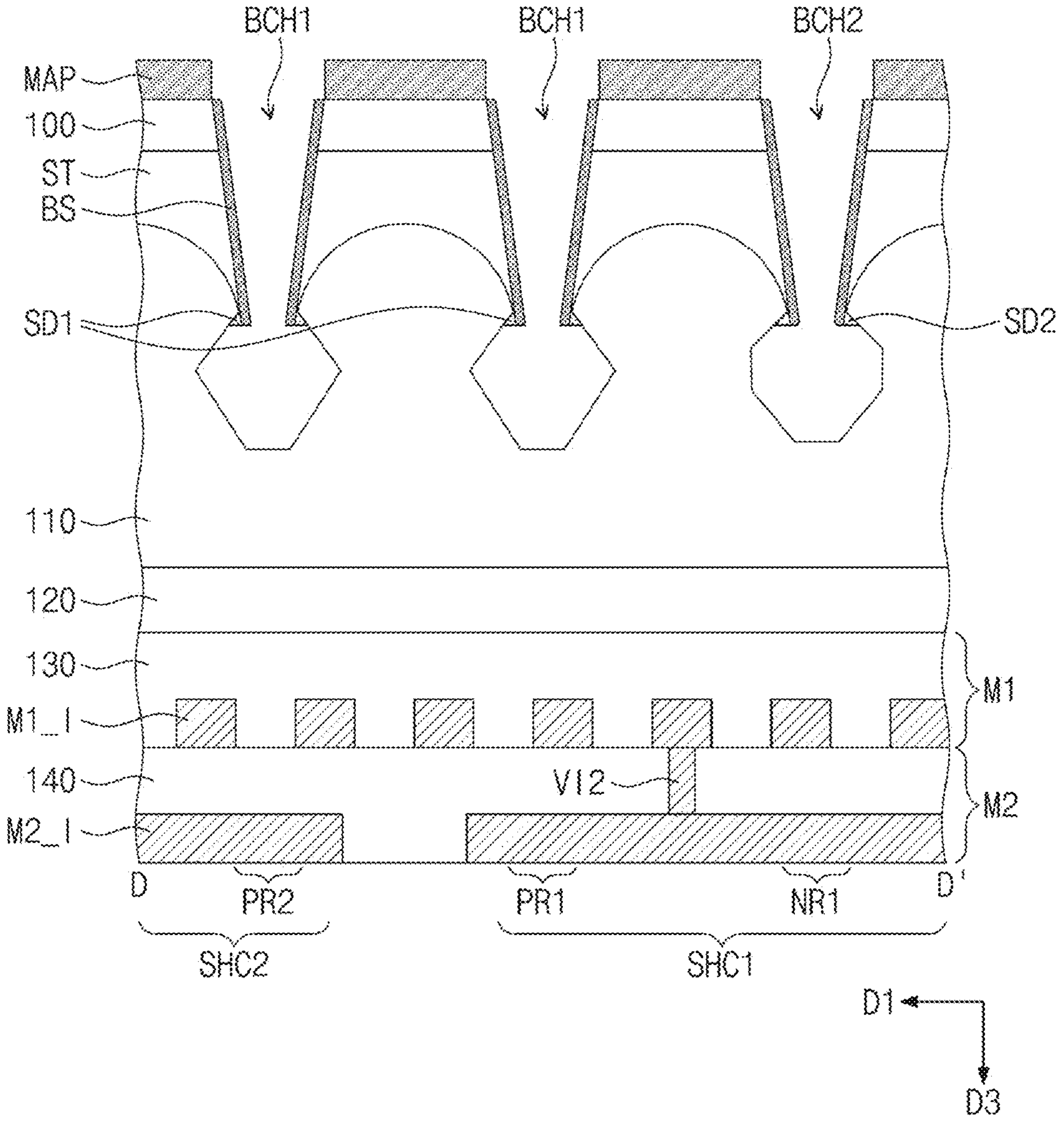

Referring to FIGS. 17A and 17B, the mask pattern MAP may be selectively removed. The second and fourth layers SEL2 and SEL4 of the first and second back-side source/drain patterns SD1*b* and SD2*b*, which are exposed by the first back-side contact hole BCH1, may be selectively removed by a first etching process. The second and fourth layers SEL2 and SEL4 may be formed of or include a material having an etch selectivity with respect to the blocking layer BL. For example, the second layer SEL2 may be formed of or include silicon germanium (SiGe), and the blocking layer BL may be formed of or include silicon (Si).

The first etching process may be a wet etching process or a dry etching process. The dry etching process may be performed using a process gas containing at least one of fluorine ($F_2$), chlorine ($Cl_2$), or hydrogen chloride (HCl), and the wet etching process may be performed using solution containing at least one of hydrogen peroxide ($H_2O_2$), acetic acid ($CH_3COOH$), or hydrogen fluoride (HF).

Although not shown, the blocking layer BL may be omitted. Here, the first layer SEL1 may have an etch selectivity with respect to the second layer SEL2, and the third layer SEL3 may have an etch selectivity with respect to the fourth layer SEL4. As an example, the first layer SEL1 may include a low concentration of silicon germanium (SiGe), and the second layer SEL2 may include a high concentration of silicon germanium (SiGe). A germanium concentration of the first layer SEL1 may range from 0 at % to 30 at %, and a germanium concentration of the second layer SEL2 may range from 30 at % to 70 at %. The difference of the germanium concentration may allow for selective removal of the second layer SEL2. In an embodiment, the third layer SEL3 may include silicon-phosphorus (SiP), and the fourth layer SEL4 may include silicon-germanium (SiGe).

As shown in FIGS. 17A and 17B, the first and second back-side contact holes BCH1 and BCH2 may have a sandglass shape. For example, each of the first and second back-side contact holes BCH1 and BCH2 may have a width in the second direction D2. The widths of the first and second back-side contact holes BCH1 and BCH2 may decrease initially and then increase in the third direction D3 from top entrances of the first and second back-side contact holes BCH1 and BCH2. For example, the first and second back-side contact holes BCH1 and BCH2 may include a first portion, which is placed in the back-side spacer BS, and a second portion, which is placed in the first and second back-side source/drain patterns SD1*b* and SD2*b*. In the first portion, the widths of the first and second back-side contact holes BCH1 and BCH2 may decrease as a distance in the third direction D3 from a top thereof increases. By contrast, in the second portion, the widths of the first and second back-side contact holes BCH1 and BCH2 may increase as the distance in the third direction D3 from a top thereof increases.

Figure 17C:
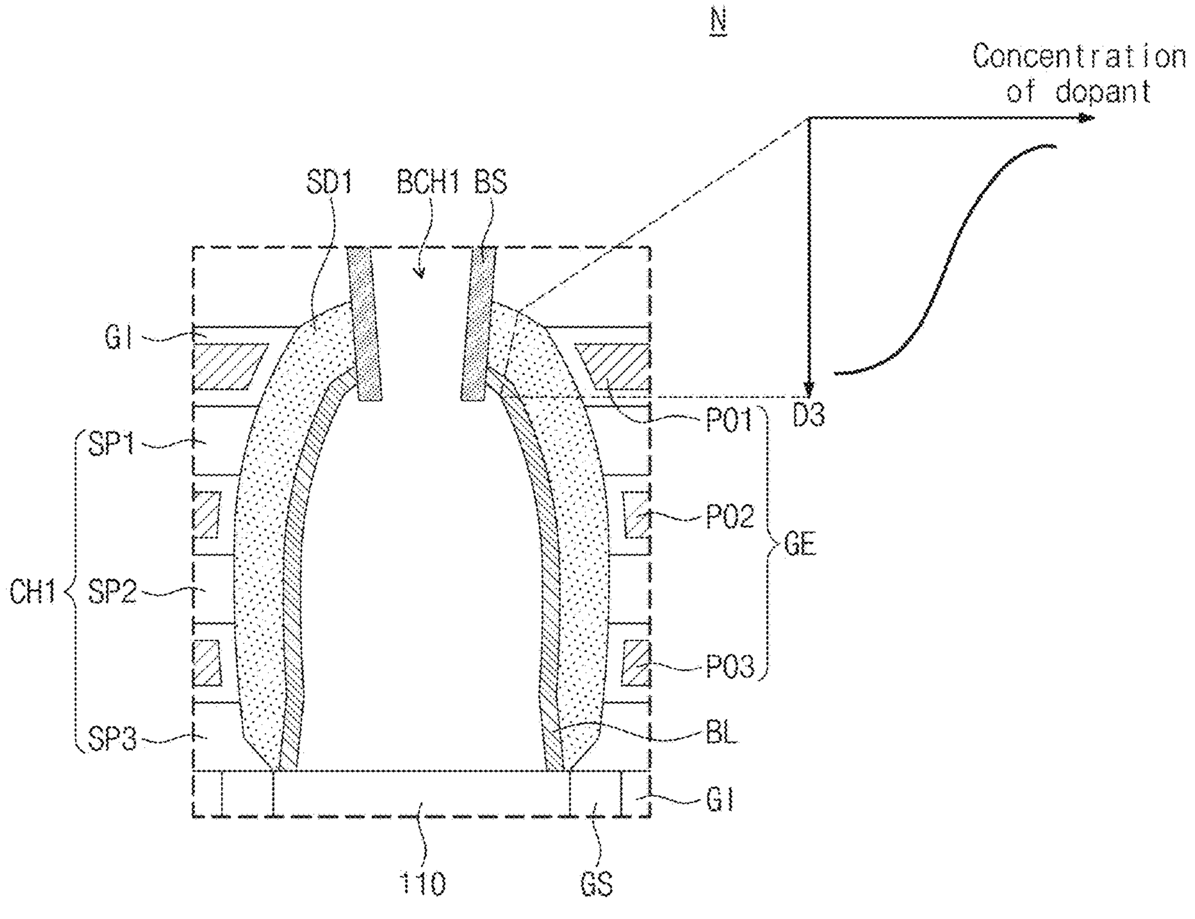

FIG. 17C is an enlarged sectional view illustrating a portion 'N' of FIG. 17A. Referring to FIG. 17C, impurities may be injected into the blocking layer BL and the first and second back-side source/drain patterns SD1*b* and SD2*b*. The impurities may be injected into the blocking layer BL by a plasma doping (PLAD) method. For example, under plasma environment, impurity ions may be injected into the blocking layer BL and the first and second back-side source/drain patterns SD1*b* and SD2*b*. In the case where the blocking layer BL is omitted, the impurities may be directly injected into inner surfaces of the first and second back-side source/drain patterns SD1*b* and SD2*b*. The impurities of the first back-side source/drain pattern SD1*b* may include at least one of boron (B), gallium (Ga), or indium (In). The impurities of the second back-side source/drain pattern SD2*b* may include at least one of arsenic (As), phosphorus (P), or antimony (Sb). In an example embodiment, impurities may be injected into the blocking layer BL through a pre-amorphization implantation (PAI) process. Here, the impurities may include at least one of argon (Ar) and germanium (Ge).

An impurity concentration of the blocking layer BL may be higher than those of the first and second back-side source/drain patterns SD1*b* and SD2*b*. The smaller the distance to the blocking layer BL, the higher the impurity concentrations of the first and second back-side source/drain patterns SD1*b* and SD2*b*. As a result of the injection of the impurities, a contact resistance between the active contact AC and the source/drain pattern SD1 or SD2 may be lowered.

Figure 18:
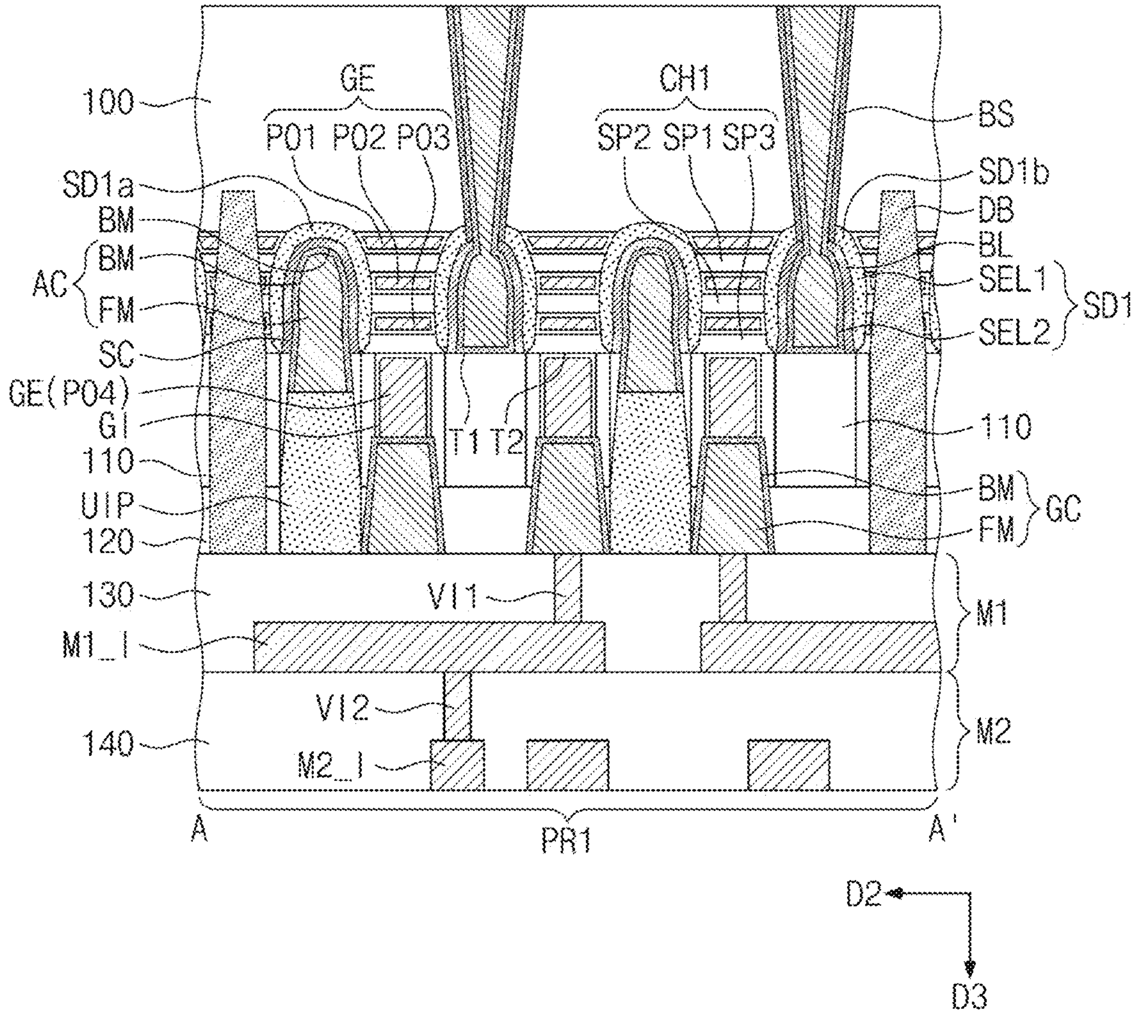
Figure 19:
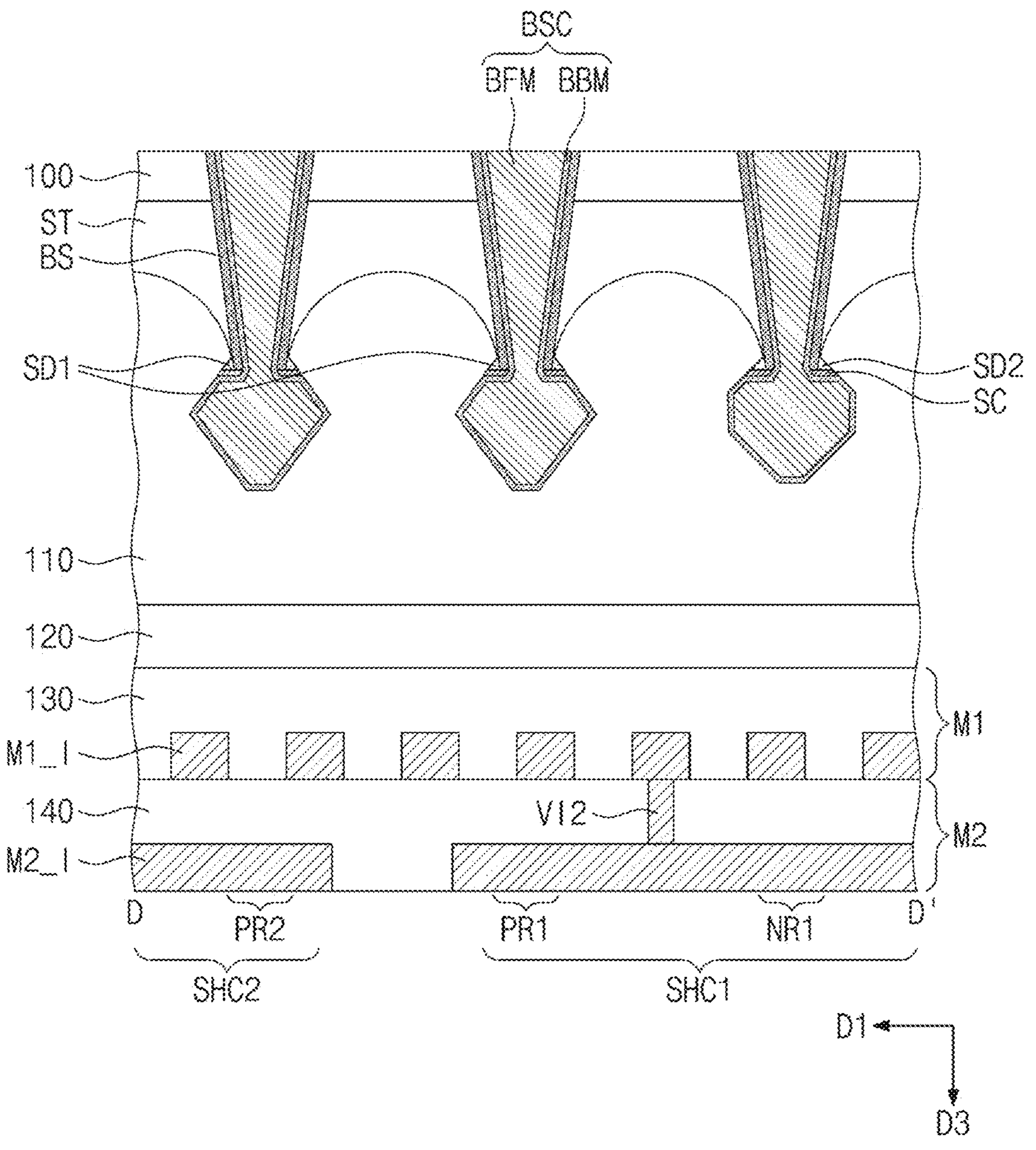

Referring to FIGS. 18 and 19, the first back-side contact BSC1 may be formed in the first back-side contact holes BCH1. The silicide layer SC may be interposed between the first back-side contact BSC1 and the first source/drain pattern SD1.

For example, the silicide layer SC may be formed by depositing a metallic material on the blocking layer BL exposed by the first back-side contact hole BCH1. The metallic material may include at least one of titanium, tantalum, tungsten, nickel, or cobalt. In this case, the silicide layer SC may be formed of or include at least one of titanium silicide, tantalum silicide, tungsten silicide, nickel silicide, or cobalt silicide. The deposition of the metallic material may include a chemical vapor deposition (CVD) process.

The first back-side contact BSC1 may be formed on the silicide layer SC. The formation of first back-side contact BSC1 may include forming the back barrier pattern BBM and forming the back conductive pattern BFM on the back barrier pattern BBM. The back barrier pattern BBM may be conformally formed to cover the top and side surfaces of the back conductive pattern BFM. The back barrier pattern BBM may include a metal layer and a metal nitride layer, and the back conductive pattern BFM may include a low resistance metal.

The second back-side contact BSC2 may be formed in the second back-side contact hole BCH2. The silicide layer SC may be interposed between the second back-side contact BSC2 and the second source/drain pattern SD2. The formation of the second back-side contact BSC2 may be substantially the same as the formation of the first back-side contact BSC1.

Referring back to FIGS. 4 and 5A to 5D, the lower power lines VPR1 to VPR3 may be formed on the semiconductor substrate 100. The lower power line VPR1, VPR2, or VPR3 may be connected to at least one of the first and second back-side contacts BSC1 and BSC2.

The power delivery network layer PDN may be formed on the lower power lines VPR1 to VPR3. The power delivery network layer PDN may be formed to apply a source or drain voltage to the lower power lines VPR1 to VPR3.

Figure 20:
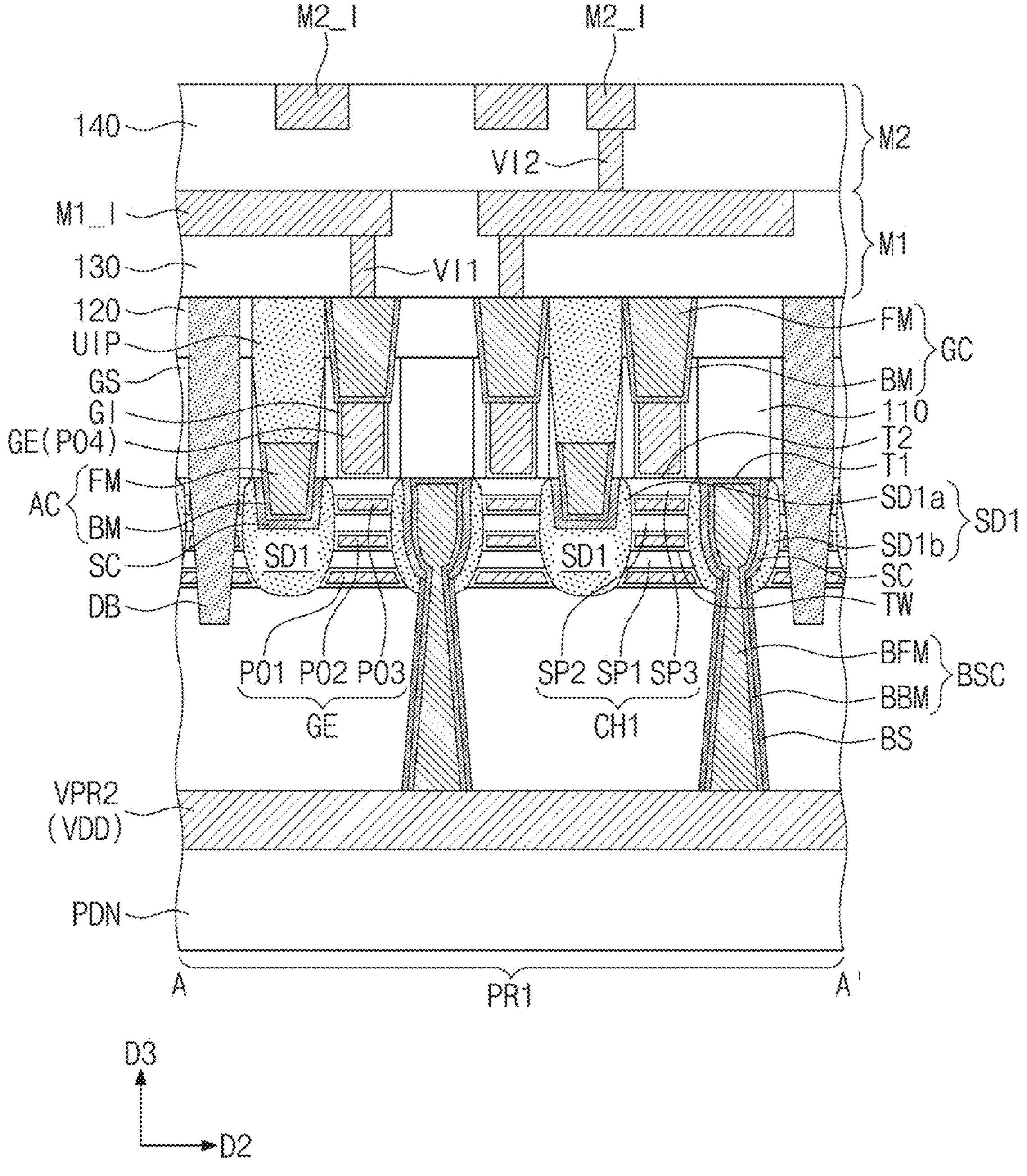
FIG. 20 is a sectional view, which is taken along the line A-A' of FIG. 4 to illustrate a semiconductor device according to an example embodiment of the inventive concepts.

FIG. 20 is a sectional view, which is taken along the line A-A' of FIG. 4 to illustrate a semiconductor device according to an example embodiment of the inventive concepts. In the description of the following example embodiments, an element previously described with reference to FIGS. 4 and 5A to 5D may be identified by the same reference number without repeating an overlapping description thereof.

Referring to FIG. 20, the bottommost surface of the active contact AC may be higher than the top surface TW of the first semiconductor pattern. This is because, when the source/drain patterns SD1 and SD2 are formed in the step of FIGS. 9A and 9B, the first and second active source/drain patterns SD1*a* and SD2*a* are formed by different processes from the first and second back-side source/drain patterns SD1*b* and SD2*b*, respectively. For example, the bottommost surface of the second layer SEL2 of the first active source/drain pattern SD1*a* may be formed to be higher than the bottommost surface of the second layer SEL2 of the first back-side source/drain pattern SD1*b*. Thus, the active contact AC may not be deeply formed toward the bottom surface of the first active source/drain pattern SD1*a*.

According to an example embodiment of the inventive concepts, a back-side contact may be connected to a source/drain pattern through an epitaxial contact in a self-aligned manner. Here, the back-side contact may penetrate the source/drain pattern and may be in contact with an interlayer insulating layer. Because the back-side contact penetrates the source/drain pattern, a contact area between the back-side contact and the source/drain pattern may be increased, and thus, a contact resistance therebetween may be reduced. In addition, an impurity region may be formed between the source/drain pattern and an active contact to reduce a contact resistance therebetween. Thus, it may be possible to improve electrical and reliability characteristics of a semiconductor device.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate;
a lower power line buried in a lower portion of the substrate;
a source/drain pattern on the substrate;
an interlayer insulating layer on the source/drain pattern; and
a back-side contact penetrating the substrate and electrically connecting the lower power line to the source/drain pattern,
wherein the back-side contact penetrates the source/drain pattern and includes a first surface in contact with the interlayer insulating layer.

2. The semiconductor device of claim 1, further comprising:
a silicide layer interposed between the back-side contact and the source/drain pattern.

3. The semiconductor device of claim 1, further comprising:
a back-side spacer interposed between the back-side contact and the substrate,
wherein the back-side spacer covers a portion of a side surface of the back-side contact.

4. The semiconductor device of claim 2, wherein a concentration of an impurity in the source/drain pattern increases as a distance to the silicide layer decreases.

5. The semiconductor device of claim 4, wherein the semiconductor device comprises a PMOSFET region including at least one of boron (B), gallium (Ga), or indium (In) as the impurity, and an NMOSFET region including at least one of arsenic (As), phosphorus (P), or antimony (Sb) as the impurity.

6. The semiconductor device of claim 2, further comprising:
a back-side spacer interposed between the back-side contact and the substrate,
wherein the back-side contact comprises a conductive pattern and a barrier pattern enclosing the conductive pattern, and
the barrier pattern is interposed between the silicide layer and the conductive pattern and between the back-side spacer and the conductive pattern.

7. The semiconductor device of claim 1, further comprising:
a plurality of semiconductor patterns serving as a channel pattern,
wherein a top surface of the back-side contact is at a same level as a top surface of an uppermost one of the plurality of semiconductor patterns.

8. The semiconductor device of claim 1, further comprising:
a plurality of semiconductor patterns serving as a channel pattern,
wherein a top surface of the back-side contact is at a level higher than a top surface of an uppermost one of the plurality of semiconductor patterns.

9. The semiconductor device of claim 1, wherein
the back-side contact has a first width at a low level thereof, a second width at a middle level thereof, and a third width at a high level thereof,
the first width is larger than the second width, and
the third width is larger than the second width.

10. A semiconductor device, comprising:
a substrate;
a lower power line buried in a lower portion of the substrate;

a first source/drain pattern and a second source/drain pattern on the substrate;

a channel pattern interposed between the first source/drain pattern and the second source/drain pattern, the channel pattern comprising a plurality of semiconductor patterns, the plurality of semiconductor patterns being vertically stacked to be spaced apart from each other, an interlayer insulating layer on the first source/drain pattern and the second source/drain pattern;

an active contact penetrating the interlayer insulating layer and electrically connected to the first source/drain pattern; and a back-side contact penetrating the substrate and electrically connecting the lower power line to the second source/drain pattern, wherein a level of a bottommost surface of the active contact is lower than a level of a top surface of a lowermost one of the plurality of semiconductor patterns, and a level of a top surface of the back-side contact is higher than the level of the top surface of the lowermost one of the plurality of semiconductor patterns.

11. The semiconductor device of claim 10, further comprising:

a silicide layer interposed between the active contact and the first source/drain pattern and between the back-side contact and the second source/drain pattern.

12. The semiconductor device of claim 11, wherein a concentration of an impurity in each of the first source/drain pattern and the second source/drain pattern increases as a distance to the silicide layer decreases.

13. The semiconductor device of claim 12, wherein the semiconductor device comprises a PMOSFET region including at least one of boron (B), gallium (Ga), or indium (In) as the impurity, and an NMOSFET region including at least one of arsenic (As), phosphorus (P), or antimony (Sb) as the impurity.

14. The semiconductor device of claim 10, further comprising:

a back-side spacer interposed between the back-side contact and the substrate, wherein the back-side spacer covers a portion of a side surface of the back-side contact.

15. The semiconductor device of claim 10, wherein the top surface of the back-side contact is at a level higher than a top surface of an uppermost one of the plurality of semiconductor patterns.

16. A semiconductor device, comprising:

a substrate;

a channel pattern on the substrate, the channel pattern comprising a plurality of semiconductor patterns stacked to be spaced apart from each other;

a source/drain pattern connected to the channel pattern;

a gate electrode on the channel pattern;

a gate insulating layer interposed between the gate electrode and the channel pattern;

a gate spacer on a side surface of the gate electrode;

a gate capping pattern on a top surface of the gate electrode;

an interlayer insulating layer covering the source/drain pattern and the gate capping pattern;

a gate contact penetrating the interlayer insulating layer and the gate capping pattern and electrically connected to the gate electrode;

a first metal layer on the interlayer insulating layer, the first metal layer comprising a first interconnection line electrically connected to the gate contact;

a second metal layer on the first metal layer, the second metal layer comprising a second interconnection line electrically connected to the first metal layer;

a lower power line in a lower portion of the substrate;

a back-side contact penetrating the substrate and electrically connecting the lower power line to the source/drain pattern; and a silicide layer interposed between the back-side contact and the source/drain pattern, wherein the back-side contact has a first width at a low level thereof, a second width at a middle level thereof, and a third width at a high level thereof, the first width is larger than the second width, and the third width is larger than the second width.

17. The semiconductor device of claim 16, further comprising:

a back-side spacer interposed between the back-side contact and the substrate, wherein the back-side spacer covers a portion of a side surface of the back-side contact.

18. The semiconductor device of claim 16, wherein a top surface of the back-side contact is at a level higher than a top surface of an uppermost one of the plurality of semiconductor patterns.

19. The semiconductor device of claim 16, wherein a concentration of an impurity in the source/drain pattern increases as a distance to the silicide layer decreases.

20. The semiconductor device of claim 19, wherein the semiconductor device comprises a PMOSFET region including at least one of boron (B), gallium (Ga), or indium (In) as the impurity, and an NMOSFET region including at least one of arsenic (As), phosphorus (P), or antimony (Sb) as the impurity.

* * * * *